US012628377B2

(12) United States Patent
Narasimha et al.

(10) Patent No.: US 12,628,377 B2
(45) Date of Patent: May 12, 2026

(54) GATE-ALL-AROUND (GAA) FIELD-EFFECT TRANSISTOR (FET) DEVICE HAVING FETS WITH DIFFERENT CRYSTALLINE ORIENTATION CHANNELS THROUGH A SUBSTRATE

(71) Applicant: QUALCOMM Incorporated, San Diego, CA (US)

(72) Inventors: Shreesh Narasimha, Charlotte, NC (US); Yan Sun, San Diego, CA (US); Peijie Feng, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 410 days.

(21) Appl. No.: 18/339,349

(22) Filed: Jun. 22, 2023

(65) Prior Publication Data
US 2024/0429300 A1     Dec. 26, 2024

(51) Int. Cl.
*H01L 29/423*        (2006.01)
*H01L 21/8238*       (2006.01)
(Continued)

(52) U.S. Cl.
CPC ....... *H10D 30/6735* (2025.01); *H10D 30/014* (2025.01); *H10D 30/43* (2025.01);
(Continued)

(58) Field of Classification Search
CPC .. H10D 30/6735; H10D 30/014; H10D 30/43; H10D 30/6757; H10D 62/121;
(Continued)

(56) References Cited

U.S. PATENT DOCUMENTS 8,330,229 B2    12/2012  Xiao et al.
8,445,963 B2    5/2013  Jakschik et al.
(Continued)

OTHER PUBLICATIONS

International Search Report and Written Opinion for International Patent Application No. PCT/US2024/033199, mailed Sep. 10, 2024, 17 pages.

*Primary Examiner* — Tong-Ho Kim
(74) *Attorney, Agent, or Firm* — Withrow & Terranova, PLLC

(57) ABSTRACT

A gate-all-around (GAA) field effect transistor (FET) device, and related fabrication methods are disclosed. The GAA FET device includes P-type semiconductor PFET(s) and N-type semiconductor NFET(s) having channels with different crystalline orientation through a substrate. The GAA PFET(s) includes a channel structure of a first type of crystalline orientation (e.g., <110> or <111>) and the GAA NFET(s) include a channel structure of a second type of crystalline orientation (e.g., <100>) different from the first type of crystalline orientation of the GAA PFET(s). The different crystalline orientation channels improve the balance of carrier mobility for both carrier types (i.e., P-type and N-type) of GAA FETs in the GAA FET device. In one aspect, the different crystalline orientation channels are provided through a substrate to increase and/or balance carrier mobility between GAA PFET(s) and NFET(s) to achieve a more balanced drive strength between these types of transistors.

17 Claims, 12 Drawing Sheets

(51) Int. Cl.

| | |
|---|---|
| *H01L 27/092* | (2006.01) |
| *H01L 29/06* | (2006.01) |
| *H01L 29/66* | (2006.01) |
| *H01L 29/775* | (2006.01) |
| *H01L 29/786* | (2006.01) |
| *H10D 30/01* | (2025.01) |
| *H10D 30/43* | (2025.01) |
| *H10D 30/67* | (2025.01) |
| *H10D 62/10* | (2025.01) |
| *H10D 84/01* | (2025.01) |
| *H10D 84/03* | (2025.01) |
| *H10D 84/85* | (2025.01) |

(52) U.S. Cl.
CPC ....... *H10D 30/6757* (2025.01); *H10D 62/121* (2025.01); *H10D 84/0167* (2025.01); *H10D 84/0188* (2025.01); *H10D 84/038* (2025.01); *H10D 84/85* (2025.01)

(58) Field of Classification Search
CPC ........... H10D 84/0167; H10D 84/0188; H10D 84/038; H10D 84/85; H10D 62/405
USPC .......................................................... 257/288
See application file for complete search history.

(56) References Cited

U.S. PATENT DOCUMENTS

| | | | | |
|---|---|---|---|---|
| 10,892,331 | B2 | 1/2021 | Yamashita et al. | |
| 11,037,835 | B2 | 6/2021 | Chen et al. | |
| 2007/0238233 | A1* | 10/2007 | Sadaka | H10D 84/0188 |
| | | | | 257/E21.628 |
| 2007/0269963 | A1* | 11/2007 | Cheng | H10D 86/01 |
| | | | | 438/479 |
| 2016/0133735 | A1 | 5/2016 | Cappellani et al. | |
| 2016/0204037 | A1 | 7/2016 | Goel et al. | |
| 2017/0179128 | A1 | 6/2017 | Balakrishnan et al. | |
| 2021/0384227 | A1* | 12/2021 | Yang | B82Y 10/00 |
| 2022/0359647 | A1 | 11/2022 | Li et al. | |

* cited by examiner

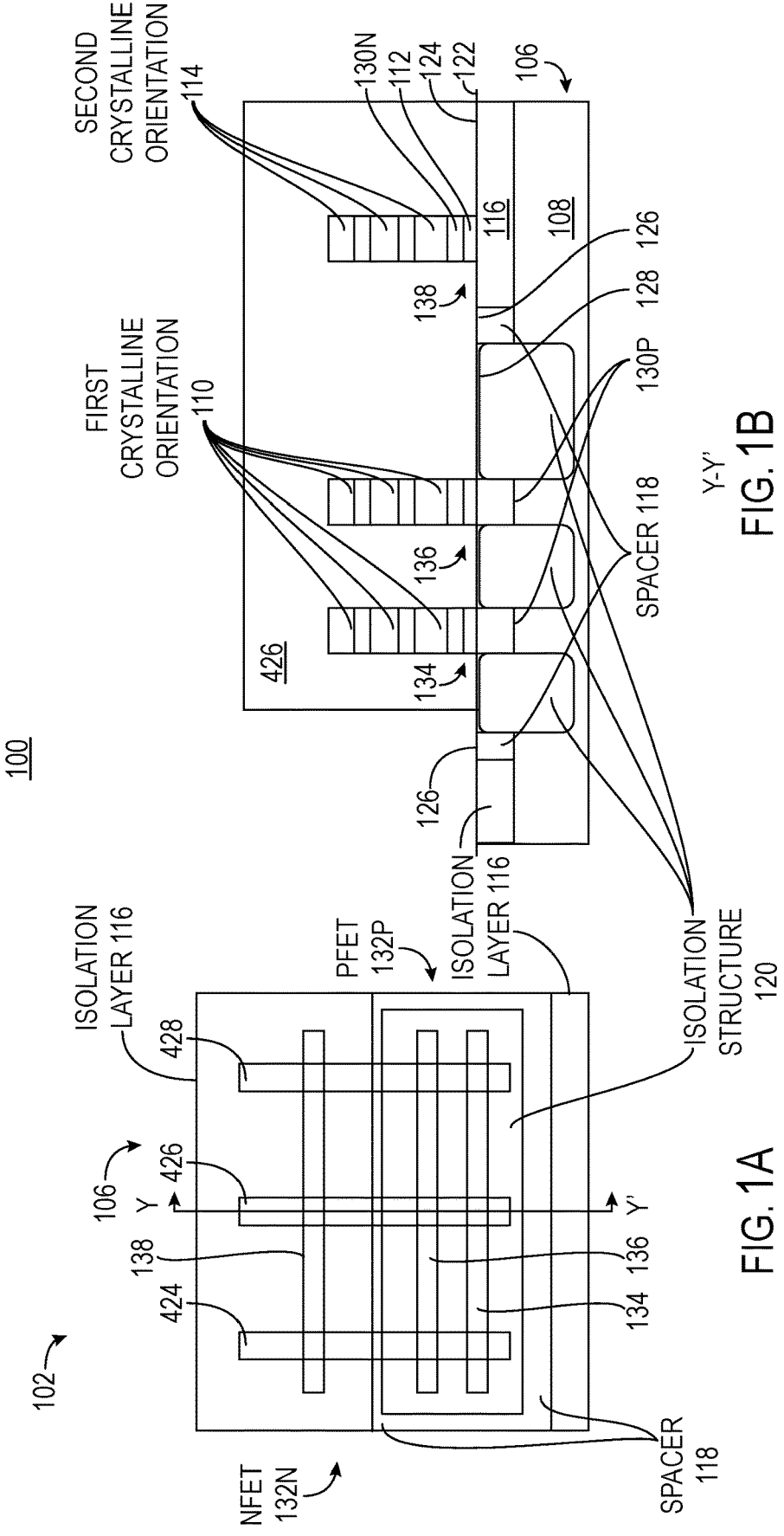

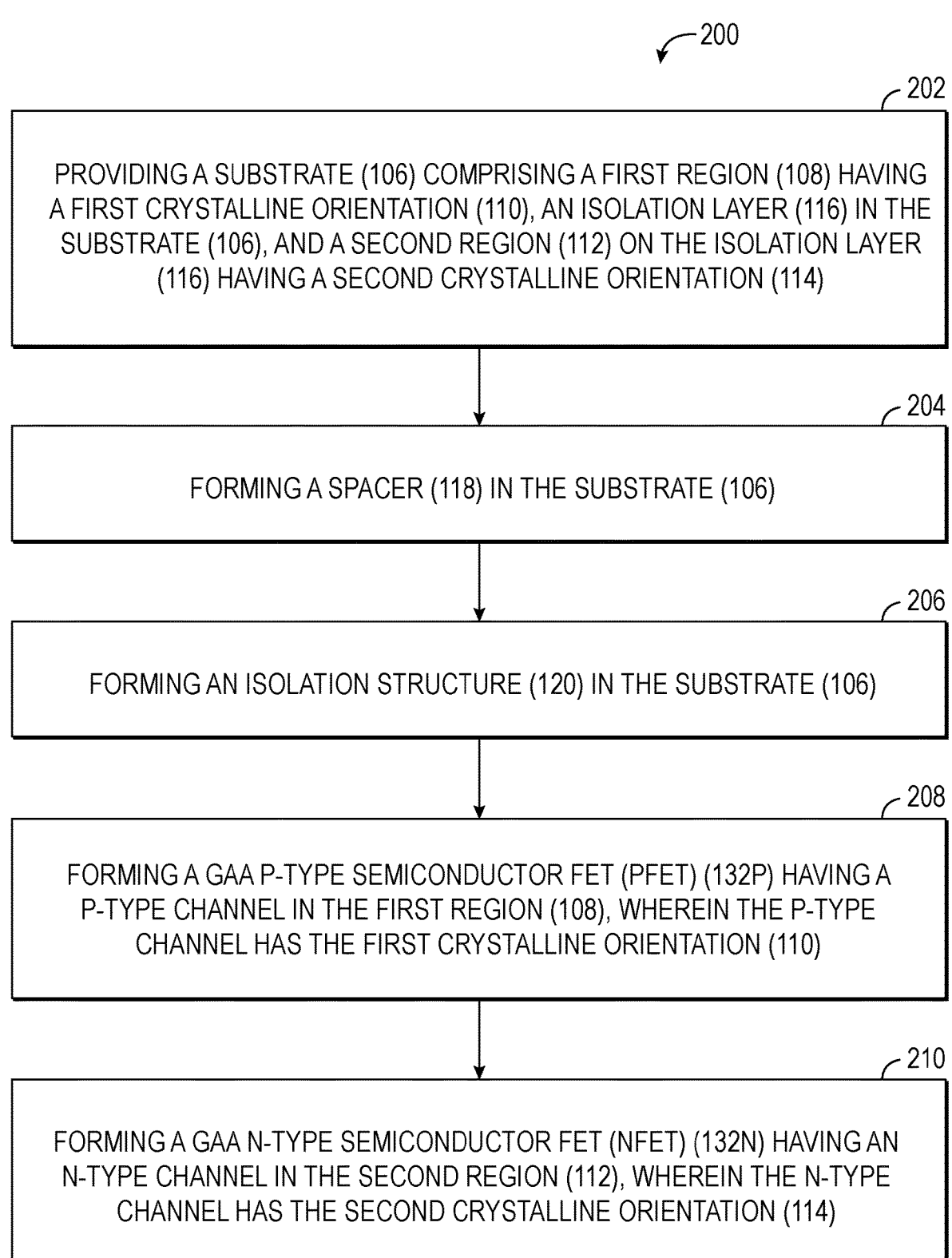

200

202

PROVIDING A SUBSTRATE (106) COMPRISING A FIRST REGION (108) HAVING A FIRST CRYSTALLINE ORIENTATION (110), AN ISOLATION LAYER (116) IN THE SUBSTRATE (106), AND A SECOND REGION (112) ON THE ISOLATION LAYER (116) HAVING A SECOND CRYSTALLINE ORIENTATION (114)

204

FORMING A SPACER (118) IN THE SUBSTRATE (106)

206

FORMING AN ISOLATION STRUCTURE (120) IN THE SUBSTRATE (106)

208

FORMING A GAA P-TYPE SEMICONDUCTOR FET (PFET) (132P) HAVING A P-TYPE CHANNEL IN THE FIRST REGION (108), WHEREIN THE P-TYPE CHANNEL HAS THE FIRST CRYSTALLINE ORIENTATION (110)

210

FORMING A GAA N-TYPE SEMICONDUCTOR FET (NFET) (132N) HAVING AN N-TYPE CHANNEL IN THE SECOND REGION (112), WHEREIN THE N-TYPE CHANNEL HAS THE SECOND CRYSTALLINE ORIENTATION (114)

FIG. 2

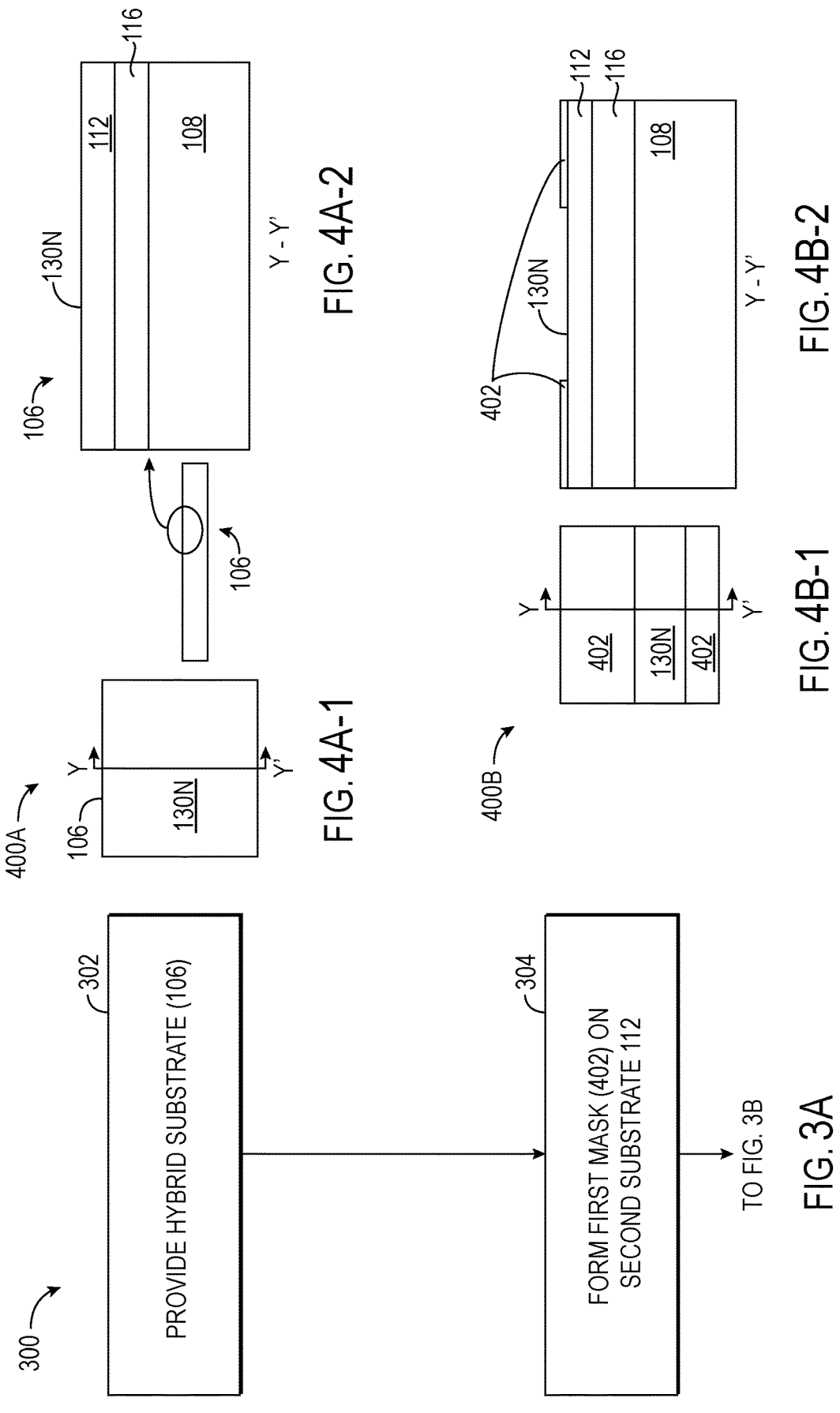

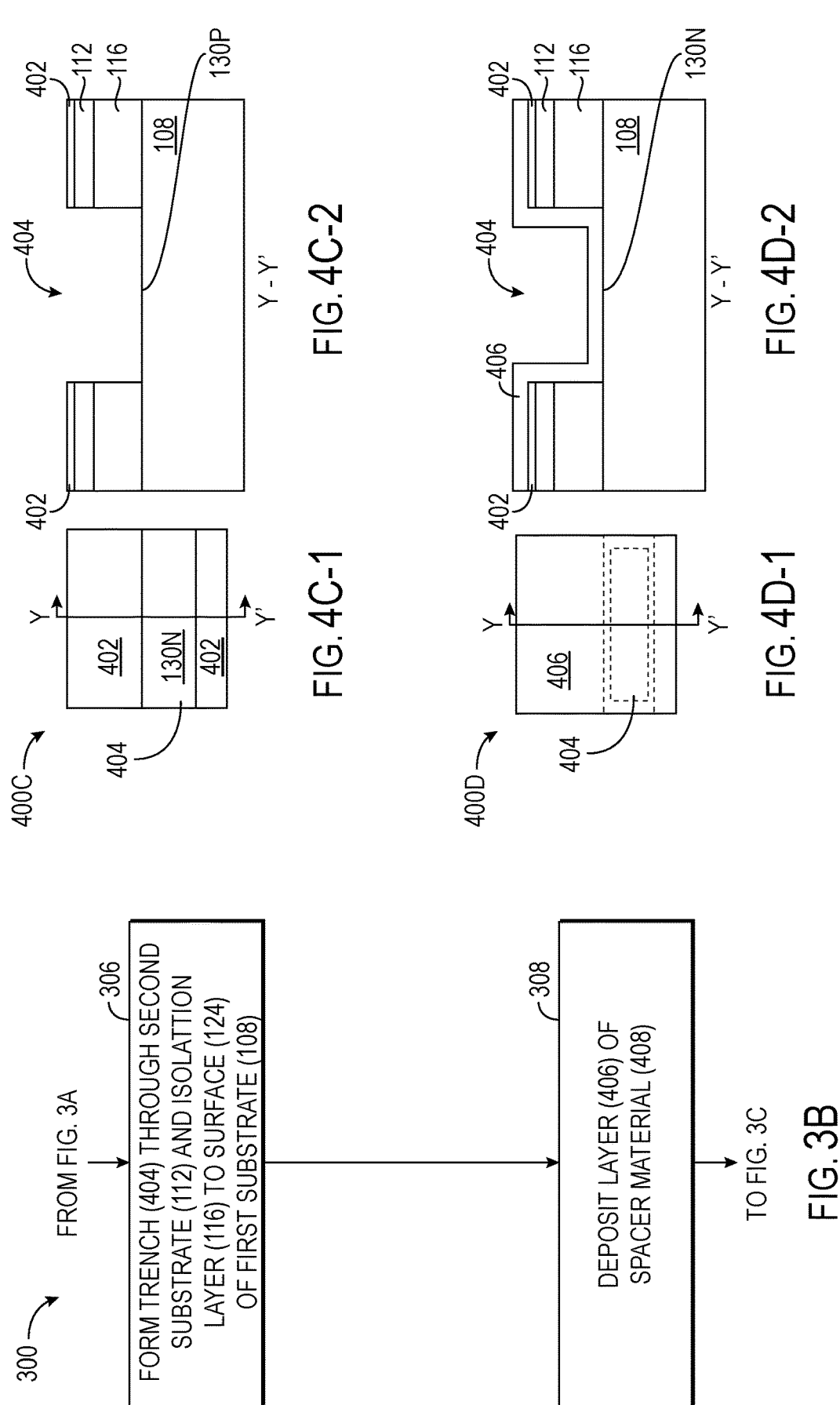

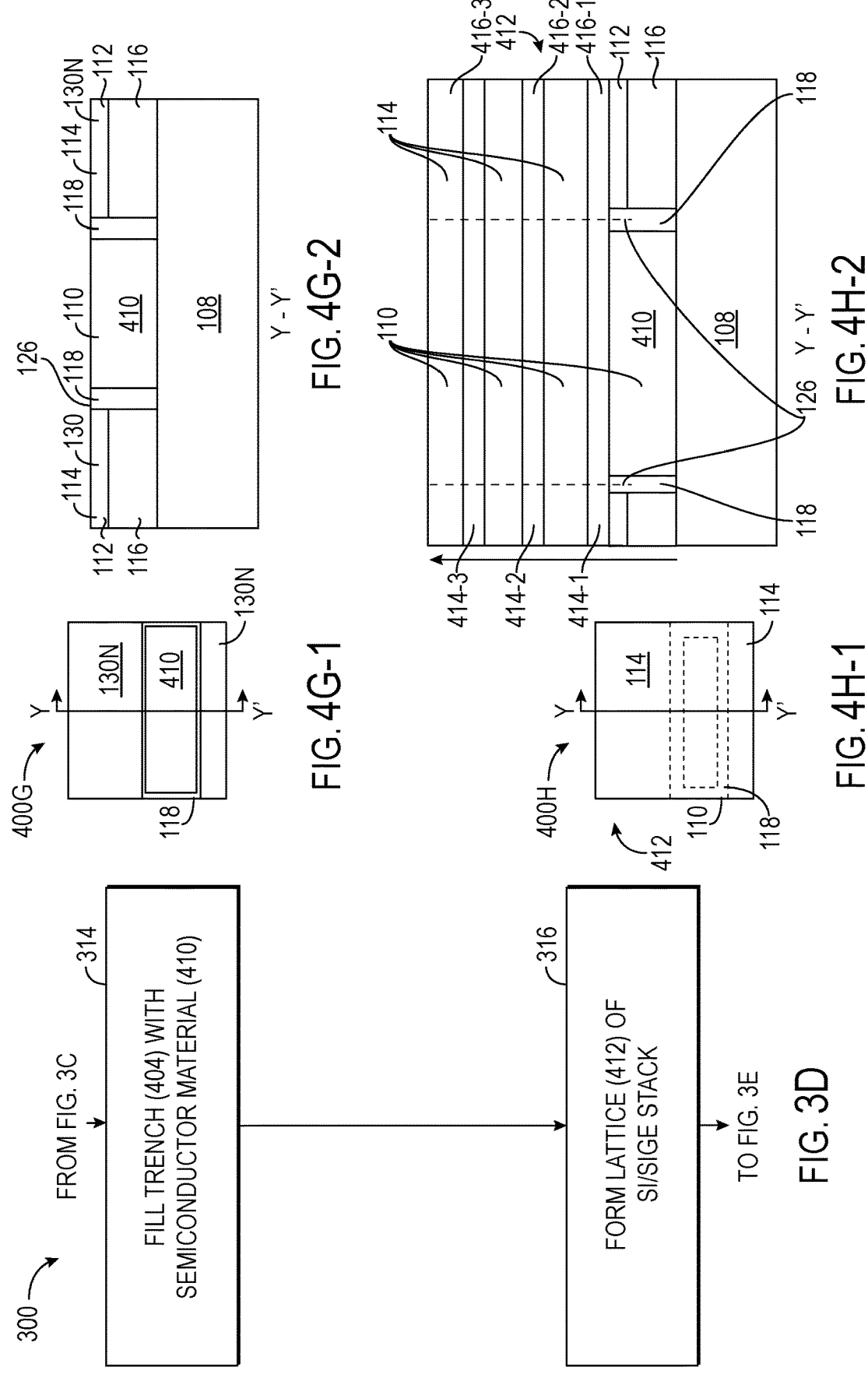

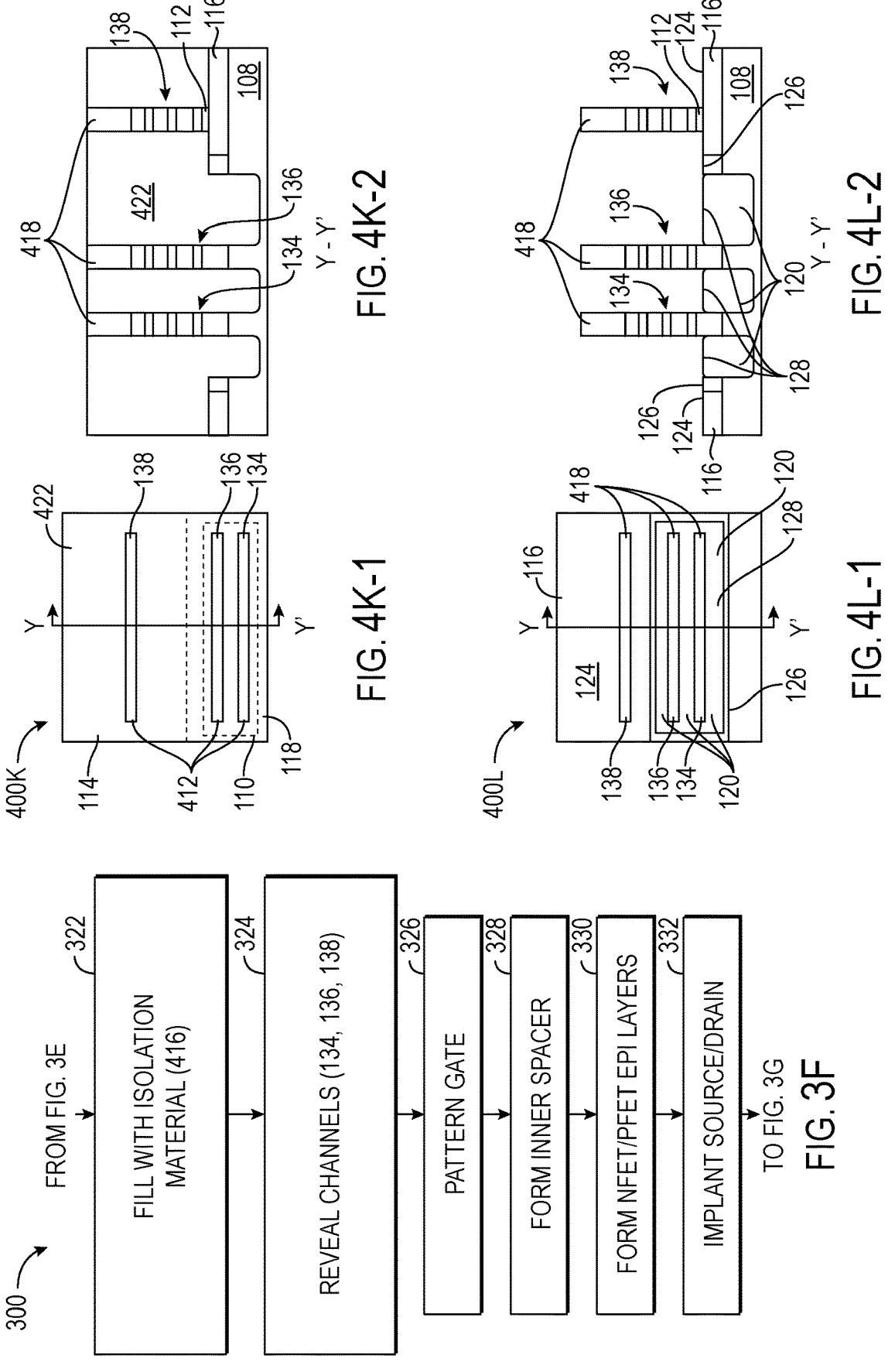

GATE-ALL-AROUND (GAA) FIELD-EFFECT TRANSISTOR (FET) DEVICE HAVING FETS WITH DIFFERENT CRYSTALLINE ORIENTATION CHANNELS THROUGH A SUBSTRATE

BACKGROUND

I. Field of the Disclosure

The technology of the disclosure relates generally to field-effect transistors (FETs), and more particularly to gate-all-around (GAA) FETs.

II. Background

Transistors are essential components in modern electronic devices. Large numbers of transistors are employed in integrated circuits (ICs) in many modern electronic devices. For example, components such as central processing units (CPUs) and memory systems each employ a large quantity of transistors for logic circuits and memory devices. As electronic devices become more complex in functionality, so does the need to increase the number of transistors in such devices, while sustaining or increasing the performance of these devices.

Planar field-effect transistors (FETs) are made up of a channel of semiconductor material, typically silicon, which is sandwiched between two electrodes, the source, and the drain. The flow of current through the channel is controlled by an electric field, which is applied by a gate electrode that is placed on top of the channel and separated from it by a thin insulating layer. Planar transistors are characterized by their flat, planar geometry, which provides a simple and compact design that is easy to manufacture and integrate into complex circuits. An increase in the number of transistors is achieved in part through continued efforts to miniaturize transistors in ICs (i.e., placing increasingly more transistors into the same amount of space). To provide greater numbers of transistors, their gate lengths are reduced in a scalable fashion, thereby reducing channel length of the transistors. For example, as the channel length in planar transistors is reduced such that the channel length is of the same order of magnitude as depletion layer widths, short channel effects (SCEs) can occur that degrade performance. More specifically, SCEs in planar transistors cause increased current leakage, reduced threshold voltage, and/or threshold voltage roll-off (i.e., reduced threshold voltage at shorter gate lengths), and therefore, reduced gate control.

In this regard, alternative FET designs to planar FETs have been developed. These alternative transistor designs provide for a gate material to wrap around at least a portion of a channel structure to provide better gate control over an active channel therein. Better gate control provides reduced current leakage and increased threshold voltage compared to a planar FET of a similar footprint. One example of a gate around FET is a FinFET. A FinFET provides a channel structure formed by a thin semiconductor material "fin" disposed above the substrate between a source and the drain. The FinFET also includes a "wrap-around" gate that wraps around top and side portions of the fin to provide gate control of the channel formed by the channel structure. However, it has become difficult to scale down the size of FinFETs due to fabrication and performance limitations. In this regard, gate-all-around (GAA) FETs have been further developed. A GAA FET includes one or more nano channel structures of semiconductor material (e.g., nanowires or nanosheets) that are stacked in relationship to each other and disposed between a source and a drain. Each nano channel structure forms part of the channel of the GAA FET. To provide better gate control of the channel, gate material is disposed all around each of the channel structures as well as between adjacent channel structures. This provides an even greater gate in the GAA FET to provide reduced current leakage and increased threshold voltage in compared to a planar FET and/or FinFET.

SUMMARY

Aspects disclosed in the detailed description include a gate-all-around (GAA) field-effect transistor (FET) device having FETs with different crystalline orientation channels through a substrate having first and second regions. Related fabrications methods are also disclosed. For example, the FETs in the GAA FET device can include both a GAA P-type semiconductor material FET(s) (PFET(s)) and a GAA N-type semiconductor material FET(s) (NFET(s)) which can be included as part of a complementary metal oxide semiconductor (CMOS) circuit. The GAA PFET(s) and the GAA NFET(s) in the GAA FET device each include a semiconductor channel ("channel") that includes one or more semiconductor channel structures ("channel structures") (e.g., a nanosheet, a nanowire). A source and drain are disposed on opposite sides of the channels. In an exemplary aspect, the GAA PFET(s) in the GAA FET device includes a P-type channel structure of a first crystalline orientation (e.g., <110> or <111>), and the GAA NFET(s) in the GAA FET device includes a N-type channel structure of a second crystalline orientation (e.g., <100>) that is different from the first crystalline orientation of the GAA PFET(s). The GAA FET device with different crystalline orientation channels improves the balance of carrier mobility for both carrier types (i.e., P-type and N-type) of GAA FETs in the GAA FET device. This is because the different carrier types have better mobility in different crystalline orientations. In this manner, the GAA PFET(s) and GAA NFET(s) in the GAA FET device can be fabricated to increase and/or balance their carrier mobility, and thus, their drive strength to try to achieve a more balanced drive strength ratio.

In this regard, in one aspect, a gate-all-around (GAA) field-effect transistor (FET) device comprises a substrate, comprising a first region having a first crystalline orientation, an isolation layer in the substrate, a second region on the isolation layer having a second crystalline orientation, a spacer in the substrate, and an isolation structure in the substrate. A GAA P-type semiconductor FET (PFET) having a P-type channel is in the first region, wherein the P-type channel has the first crystalline orientation. A GAA N-type semiconductor FET (NFET) having an N-type channel is in the second region, wherein the N-type channel has the second crystalline orientation.

In another aspect, a method of fabricating a gate-all-around (GAA) field effect transistor (FET) device is provided. A substrate is provided comprising a first region having a first crystalline orientation, an isolation layer in the substrate, and a second region on the isolation layer having a second crystalline orientation. A spacer is formed in the substrate. An isolation structure is formed in the substrate. A GAA P-type semiconductor FET (PFET) is formed having a P-type channel in the first region, wherein the P-type channel has the first crystalline orientation. A GAA N-type semiconductor FET (NFET) is formed having an N-type channel in the second region, wherein the N-type channel has the second crystalline orientation.

BRIEF DESCRIPTION OF THE DRAWINGS

FIG. 1A is a top view of an exemplary gate-all-around (GAA) field-effect transistor (FET) device at an intermediate fabrication stage that includes a P-type semiconductor material FET (PFET) and an N-type semiconductor material FET (NFET) provided on respective first and second regions of a substrate with different crystalline orientations to form respective channels of such different crystalline orientations for affecting carrier mobility;

FIG. 1B is a cross-sectional view of exemplary GAA FETs in the GAA FET device shown in FIG. 1A;

FIG. 2 is a flowchart illustrating an exemplary fabrication process for the GAA FET device on a substrate having first and second regions with different crystalline orientations to provide a GAA PFET(s) having a P-type channel on the first region of a first crystalline orientation and a GAA NFET(s) having a N-type channel on the second regions of a second crystalline orientation, including, but not limited to, the GAA FET device in FIGS. 1A and 1B;

FIGS. 3A-3G is a flowchart illustrating another exemplary fabrication process of fabricating a GAA FET device provided on a substrate having first and second regions with different crystalline orientations to provide a GAA PFET(s) having a P-type channel on the first region of a first crystalline orientation and a GAA NFET(s) having a N-type channel on the second region of a second crystalline orientation, including, but not limited to, the GAA FET device in FIGS. 1A and 1B;

FIGS. 4A-4N-2 are exemplary fabrication stages showing exemplary top and cross-sectional views during fabrication of a GAA FET device provided on a substrate having first and second regions with different crystalline orientations, according to the exemplary fabrication process in FIGS. 3A-3G;

DETAILED DESCRIPTION

Figures 1C, 1D:
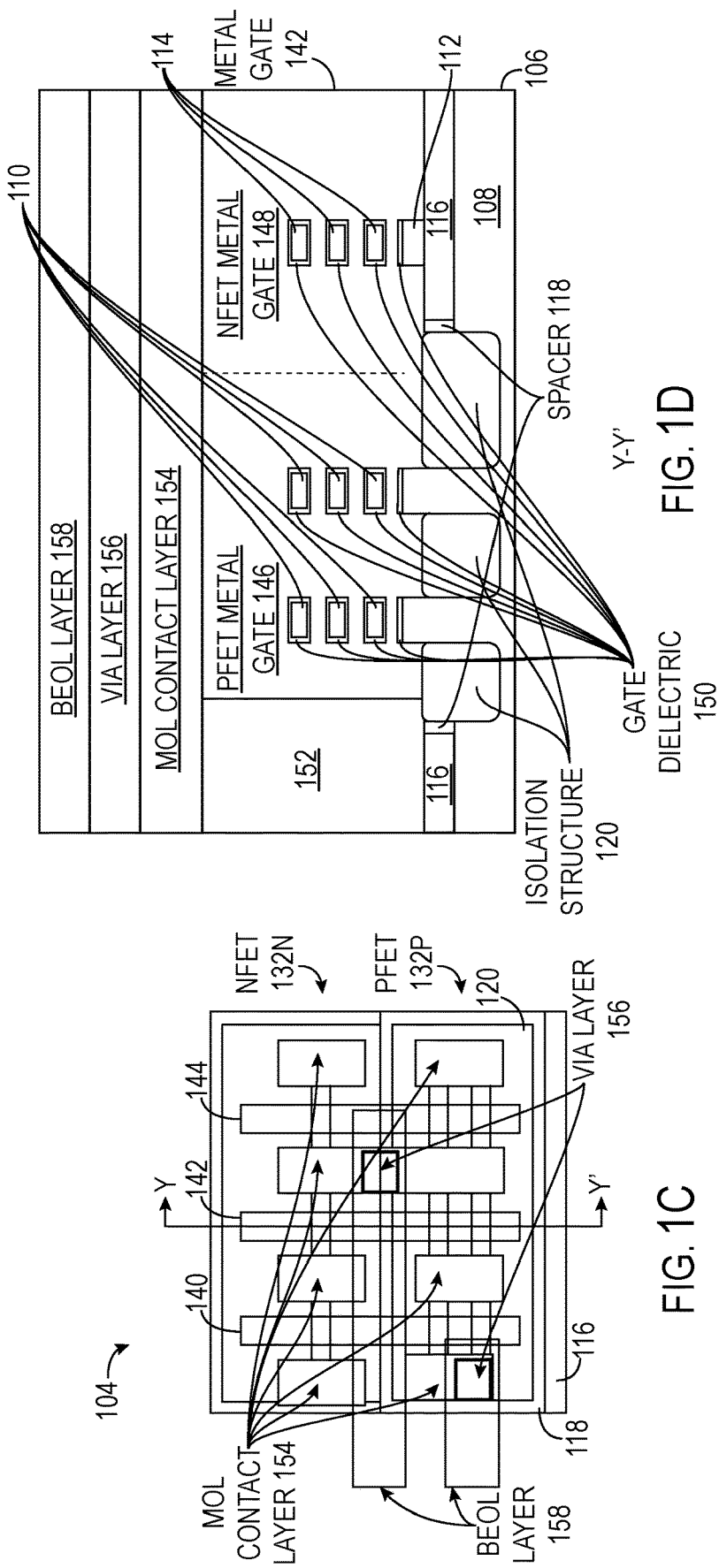
FIG. 1C is a top view of an exemplary GAA FET device at a later fabrication stage from the fabrication stage shown in FIG. 1A that includes a PFET and an NFET provided on respective first and second regions of a substrate with different crystalline orientations to form respective channels of such different crystalline orientations for affecting carrier mobility.
FIG. 1D is a cross-sectional view of exemplary GAA FETs in the GAA FET device shown in FIG. 1C.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include a gate-all-around (GAA) field effector transistor (FET) device having FETs with different crystalline orientation channels through a substrate. Related fabrication methods are also disclosed. For example, the FETs in the GAA FET device can include both a GAA P-type semiconductor material FET(s) (PFET(s)) and a GAA N-type semiconductor material FET(s) (NFET(s)) which can be included as part of a complementary metal oxide semiconductor (CMOS) circuit. The GAA PFET(s) and GAA NFET(s) in the GAA FET device each include a semiconductor channel ("channel") that includes one or more semiconductor channel structures ("channel structures") (e.g., a nanosheet, a nanowire). A source and drain are disposed on opposite sides of the channels. An all-around gate is provided around the channel and controls current flowing between the source/drain through the channel. In an exemplary aspect, the GAA PFET(s) in the GAA FET device include a P-type channel with P-type channel structures of a first type of crystalline orientation (e.g., <110> or <111>), and the GAA NFET(s) in the GAA FET device include a N-type channel with N-type channel structures of a second type of crystalline orientation (e.g., <100>) that is different from the crystalline orientation of the GAA PFET(s). The GAA FET device with different orientation channels improves the balance of carrier mobility for both carrier types (i.e., P-type and N-type) of GAA FET(s) in the GAA FET device. This is because the different carrier types have better mobility in different crystalline orientations. In this manner, the GAA PFET(s) and GAA NFET(s) in the GAA FET device can be fabricated with improved balance of their carrier mobility, and for example, their drive strength to try to achieve a more balanced drive strength ratio.

In exemplary aspects, to provide for the GAA PFET(s) and GAA NFET(s) in the GAA FET device to have respective channels of different crystalline orientation, the GAA FET device includes a substrate with first and second regions having different crystalline orientations. The substrate comprises a hybrid surface, a first region having a first crystalline orientation, an isolation layer on the first region, and a second region on the isolation layer. To enable fabrication of GAA PFET(s) and GAA NFET(s) with different crystalline orientations, the substrate also comprises a spacer and an isolation structure. The spacer is disposed between the isolation layer and the isolation structure at the hybrid surface of the substrate. The isolation structure is disposed between the spacer and the first region and extends into the substrate. The isolation structure may extend to various depths into the substrate. A GAA PFET having a P-type channel with P-type channel structures is provided on the first region. A GAA NFET having an N-type channel with N-type channel structures is provided on the second region. Hence, the GAA FET device having a substrate allows the GAA FET device to have different crystalline orientation channels for a GAA PFET(s) and GAA NFET(s). As noted, this may improve or balance carrier mobility and may balance the drive strength between the GAA PFET(s) and GAA NFET(s). In addition, the isolation layer, spacer, and isolation structure separate and provide improved isolation between the GAA PFET and GAA NFET.

In another exemplary aspect, the spacer enables the GAA FET device to be fabricated with channels having co-planar and uniform layer thickness of channel structures for both the GAA PFET(s) and GAA NFET(s). The spacer is co-planar with the hybrid surface of the substrate and provides a lateral separation between the first region and second region. During fabrication, this lateral separation at the hybrid surface provided by the spacer's first, top end allows the layers of the channel structures for both the GAA PFET(s) and GAA NFET(s) to be grown unconstrained within the same fabrication pass, i.e., without the need for a pattern or mask. Unconstrained growth enables growth of high quality, uniform thickness layers that are aligned co-planar since it is not constrained by a pattern or mask. These high quality co-planar layers allow for greater design flex-ibility, better fabrication process yields, and better device performance.

In this regard, FIGS. 1A and 1B illustrate a top view and a cross-sectional (Y-Y') view, respectively, of a GAA FET device 100 at an intermediate fabrication stage 102. FIGS. 1C and 1D are also provided to illustrate a top view and a cross-sectional (Y-Y') view, respectively, at a later fabrica-tion stage 104.

Referring now to FIGS. 1A and 1B, at fabrication stage 102, the GAA FET device 100 comprises a PFET(s) 132P and an NFET(s) 132N provided on a substrate 106. The substrate 106 is a hybrid of a first region 108 having a first crystalline orientation 110 and a second region 112 having a second crystalline orientation 114. In addition, the substrate 106 comprises an isolation layer 116 between (e.g., verti-cally) the first region 108 and the second region 112. A spacer 118 and an isolation structure 120 are provided between (e.g., horizontally) the GAA PFET(s) 132P and GAA NFET(s) 132N. The spacer 118 may generally be 5-10 nanometers (nm) in thickness and comprises a suitable material, such as silicon dioxide ($SiO_2$). The isolation struc-ture 120 may generally be 50-100 nm or more in thickness and comprise a suitable material, such as an oxide material. The isolation layer 116 and isolation structure 120 provide isolation between the GAA PFET(s) 132P and GAA NFET(s) 132N to prevent electrical crosstalk and reduce parasitic capacitance.

FIGS. 1A and 1B are merely exemplary and it should be understood that the GAA PFET(s) 132P and GAA NFET(s) 132N for the GAA FET device 100 may be configured differently. For example, the GAA PFET(s) 132P may be fabricated on the second region 112 and GAA NFET(s) 132N may be fabricated on the first region 108.

As shown, the GAA PFET(s) 132P and GAA NFET(s) 132N may comprise various fin-like shaped channel struc-tures for their channels and gates depending on the desired performance, such as drive strength, impedance, etc. For example, the GAA PFET(s) 132P and GAA NFET(s) 132N may comprise the same number of channels, or alternatively, a different number of channels. For purposes of illustration, in the example shown, the GAA PFET(s) 132P includes multiple fin-link channel structures, such as channel struc-tures 134, 136, while the GAA NFET(s) 132N may include a single fin-like channel structure, such as channel structure 138. The GAA PFET(s) 132P and GAA NFET(s) 132N are shown in the figures with different numbers of fin-like shaped channel structures for illustrative purposes only. The GAA PFET(s) 132P and GAA NFET(s) 132N may include any number of channels and/or channel structures.

At fabrication stage 102, the GAA FET device 100 also comprises dummy gates 424, 426, 428 (also shown in FIGS. 4M-1, 4M-2, 4N-1, 4N-2 below), which are a preliminary or placeholder structure used during fabrication for defining the channels and their channel structures 134, 136, 138. In one aspect, the dummy gates 424, 426, 428 are formed using material, such as polysilicon or metal. In the example shown in FIG. 1A, the GAA FET device 100 comprises three dummy gates. However, any number of gates may be implemented in the GAA FET device 100. As shown, the dummy gates 424, 426, 428 surround the P-type channel structures 134, 136, and N-type channel structure 138.

The GAA FET device 100 utilizes the substrate 106, and at least one of the surfaces, a hybrid surface 122, to enable channels with different crystalline orientations 110, 114 upon which the GAA PFET(s) 132P and GAA NFET(s) 132N can be fabricated, which is described further with reference to FIGS. 2, 3A-3G, and 4A-1-4N-2. As shown, the substrate 106 extends in a first, horizontal direction and in a second, vertical direction. As noted previously, the substrate 106 comprises the first region 108 having the first crystalline orientation 110, the isolation layer 116, and the second region 112 having the second crystalline orientation 114. In addition, the isolation structure 120 provides separation and isolation between the GAA PFET(s) 132P and GAA NFET(s) 132N.

As shown, in an aspect, the hybrid surface 122 of the substrate 106 is one of the surfaces or a top surface of the substrate 106. The hybrid surface 122 separates and isolates, in the first, horizontal direction, between crystalline orien-tations 110, 114 of the first and second regions 108, 112, respectively. In an aspect, the hybrid surface 122 of substrate 106 may be a hybrid that includes an isolation layer surface 124 (of the isolation layer 116), a spacer surface 126 (of the spacer 118), and isolation structure surface 128 (of the isolation structure 120). The isolation layer surface 124 of the isolation layer 116 separates and isolates the second region 112, which is provided in the second, vertical direc-tion on, above the isolation layer 116. The isolation layer 116 also separates and isolates in the second, vertical direction between the first region 108 and the second region 112 to preserve and maintain their different crystalline orientations 110, 114, respectively. The spacer surface 126 separates and isolates the first region 108, the isolation layer 116, and the second region 112 in the first, horizontal direction. In an exemplary aspect, the spacer 118 and its spacer surface 126 is disposed at the hybrid surface 122 and the spacer 118 extends into the substrate 106 without extending beyond, above the hybrid surface 122. In this manner, as an example, the channel structures 134, 136 for the GAA PFET(s) 132P and the channel structure 138 for the GAA NFET(s) 132N can be formed on the hybrid surface 122 in a single process step and take on the crystalline orientation 110, 114 of their respective underlying first and second regions 108, 112 in an unconstrained manner since the spacer 118 does not extend beyond, above the hybrid surface 122.

The isolation structure 120 may extend to various depths into the substrate 106. In an aspect, the isolation structure 120 may extend to a depth, such as 50-100 nm, in the substrate 106 to the same extent as the isolation layer 116. In another exemplary aspect, an isolation structure 120 is created to extend deeper, such as 100 nm or more, into the substrate 106 to provide further electrical isolation between the first and second regions 108, 112. In the example shown, the isolation structure 120 comprises an isolation structure surface 128, which is disposed between the spacer 118 and the first region 108 at the hybrid surface 122. The isolation structure 120 thus provides electrical isolation between the neighboring channel structures, such as the channel struc-tures 134, 136, 138. Any depth for the isolation structure 120 that achieves the desired electrical isolation can be imple-mented in various aspects. As noted, the isolation structure 120 may also be referred to as a shallow trench isolation (or STI).

Based on the separation and isolation provided by the spacer 118 and the isolation structure 120 in the first, horizontal direction and in the second, vertical direction, the channel structures 134, 136 versus 138 can be fabricated with different crystalline orientations 110, 114. Accordingly, the GAA PFET(s) 132P has a P-type channel with P-type channel structures 134, 136 and the GAA NFET(s) 132N has an N-type channel with N-type channel structure 138. In this example, the channel structures 134, 136, 138 have different respective crystalline orientations (such as the first crystalline orientation 110 and the second crystalline orientation 114) to enable improved carrier mobility and drive strength. In conventional GAA FETs, a GAA device is limited to a single crystal orientation for both types of channels. This has been found to result in a weakness or suppression in hole (P-type) mobility relative to electron (N-type) mobility. As noted, N-type carriers (or electrons) have higher mobility than P-type carriers (or holes). The channel in a GAA FET typically includes channel structures that are a thin strip or wire of semiconductor material that is sandwiched between the gate and the gate dielectric layer, e.g., a silicon dioxide insulator layer. These types of narrow, thin channel structures tend to affect P-type carriers more than N-type carriers. Thus, in GAA FETs having a GAA PFET(s), balancing carrier mobility can be a challenge relative to a GAA NFET(s). Although the channel material can be made from a variety of semiconductor materials, its crystal orientation is typically a single orientation. The crystalline orientation is an important factor in determining the mobility of both types of carriers, including P-type (holes) and N-type (electrons).

For example, the use of silicon crystalline orientation <100> for a GAA device may compromise the P-type carrier mobility in the PFET(s). This is because the <100> crystalline orientation has a lower P-type mobility due to the anisotropic nature of the crystal structure, compared to other orientations such as <110> or <111>. Weak P-type mobility in GAA FETs is thus affected by the crystal orientation. Therefore, there is a need to enhance and balance carrier mobility for GAA FETs, particularly a GAA PFET(s), and develop alternative designs that balance the performance of GAA PFET(s) and NFET(s).

Accordingly, in an exemplary aspect, the GAA FET device 100 in FIGS. 1A-1D is not limited to a single crystalline orientation and employs different crystalline orientations enabled by the substrate 106. As noted above, the substrate 106 is a semiconductor substrate that is a hybrid of the first region 108 having the first crystalline orientation 110 (e.g., for a P-type carrier) and the second region 112 having the second, different crystalline orientation 114 (e.g., for a N-type carrier). As will be described below, the substrate 106 provides exposure to both a surface 130P of the first region 108 and a surface 130N of the second region 112. This enables fabrication of GAA FET device 100 with GAA PFET(s) 132P and GAA NFET(s) 132N to have different crystalline orientations for the channels in their channel structures 134, 136, 138.

In this example, the GAA PFET(s) 132P includes P-type channel structures 134, 136 having the first crystalline orientation 110 (e.g., <110> or <111>) grown from the first region 108. Likewise, the GAA NFET(s) 132N can include the N-type channel structure 138 having the second crystalline orientation 114 (e.g., <100>) grown from the second region 112. As noted, the GAA PFET(s) 132P and GAA NFET(s) 132N are illustrated with different numbers of channel structures for illustrative purposes only. The different crystalline orientations 110, 114 for the channel structures 134, 136, 138 allow the GAA FET device 100 to have an improved balance of carrier mobility for both carrier types (i.e., P-type and N-type). As noted, this is because the different carrier types have better mobility in different crystalline orientations, e.g., <110> for P-type carriers in the P-type channel structures 134, 136 and <100> for N-type carriers in the N-type channel structure 138.

To provide substrates with different crystalline orientations 110, 114, the substrate 106 includes the isolation layer 116 that separates and isolates the first region 108 and the second region 112. The isolation layer 116 may be referred to as a buried layer since it is provided in the substrate 106 between the first region 108 and the second region 112, in the second, vertical direction. The isolation layer 116 may comprise any insulating material, such as an oxide, and thus may also be referred to as a "buried oxide (BOX) layer." Laterally in the first, horizontal direction, the isolation layer 116 may be bound by the spacer 118. Accordingly, at hybrid surface 122, the isolation layer surface 124 is also bounded by the spacer surface 126. In one aspect, the isolation layer 116 and the spacer 118 may extend in the second, vertical direction to the same depth within the substrate 106. The isolation layer 116 may comprise an insulating material, such as an oxide, like silicon dioxide ($SiO_2$). The isolation layer 116 may vary in thickness, e.g., from nanometers to micrometers in thickness, depending on the desired isolation, mechanical support needed for the first region 108, and process constraints for fabrication of the GAA FET device 100.

Regarding the spacer 118, it provides, at least partially or fully, lateral separation in the first, horizontal direction between the first region 108 and the second region 112 and includes the spacer surface 126 at the hybrid surface 122. The spacer 118 also extends in the second, vertical direction from the hybrid surface 122 into the substrate 106. The spacer 118 can be any insulating material, such as silicon dioxide or silicon nitride. The spacer 118 can vary in thickness, e.g., from nanometers to micrometers in thickness, depending on desired isolation between the first region 108 and second region 112. As shown, in one aspect, the spacer 118 and the isolation layer 116 may extend in the second, vertical direction to the same depth in the substrate 106.

For purposes of illustration, FIGS. 1A and 1B show (at fabrication stage 102) that the GAA PFET(s) 132P comprises multiple fin-like shaped channel structures 134, 136 and the GAA NFET(s) 132N comprises a single fin-like channel structure 138. As noted previously, in one aspect, the channel structures 134, 136 are a P-type channel formed from semiconductor material grown and patterned on a surface 130P of the first region 108. As noted, the different number of channel structures shown in the figures is for illustrative purposes only. The GAA PFET(s) 132P and GAA NFET(s) can also include the same number of channel structures. Since the channel structures 134, 136 are from the surface 130P with the first crystalline orientation 110, they will have the same crystalline orientation 110 as the first region 108 (e.g., a crystalline orientation of <110> or <111>). In addition, portions of the second region 112 are on the hybrid surface 122 of the substrate 106 and includes a surface 130N, which has a different crystalline orientation 114 (e.g., a crystalline orientation of <100>) than the surface 130P of the first region 108. Thus, in an aspect, the channel structure 138 is patterned and grown from the surface 130N as an N-type channel, and thus, has the same crystalline orientation 114 of the second region 112, but which is different from the crystalline orientation 110 of the first region 108.

In another aspect, because of the separation provided by the spacer 118 and the isolation structure 120, the various layers for the channel structures 134, 136, 138 can be formed within the same pass of the fabrication process and will be aligned co-planar horizontally (e.g. in the X-Y plane shown in FIGS. 1A and 1B) at each respective layer, as will be further described below with reference to FIGS. 2, 3A-3G, and 4A-4N-2. The isolation structure 120 may be referred to as a shallow trench isolation (or STI). This simplifies and reduces the number of stages in the fabrication process while still enabling the GAA FET device 100 to have the GAA PFET(s) 132P and the GAA NFET(s) 132N with different crystalline orientations 110 and 114 in their channel structures 134, 136 and 138, respectively.

Referring now to FIG. 1C, a top view of the exemplary GAA device 100 with GAA PFET(s) 132P and GAA NFET (s) 132N is shown at a fabrication stage 104 which is later than the fabrication stage 102 shown in FIG. 1A. FIG. 1D is a cross-sectional view of exemplary GAA FETs 132P, 132N in the GAA FET device 100 shown in FIG. 1C. For purposes of brevity and clarity of the drawings, features of the GAA FET device 100 having the same reference number are not redescribed here with reference to FIGS. 1C and 1D.

To proceed from fabrication stage 102 to 104, various known fabrication processes may be performed, such as junction and via formation, polysilicon lithography and etching, metal gate deposition, middle of line processes, and back-end-of-line processes. For example, between fabrication stage 102 and 104, the dummy gates 424, 426, 428 have been patterned and etched and connected electrically to other layers of the GAA FET device 100 to form an operating device, such as a CMOS device.

In this regard, at fabrication stage 104, the GAA FET device 100 now comprises metal gates 140, 142, 144 to control the current flowing through the GAA PFET(s) 132P and GAA NFET(s) 132N, respectively. The gates 140, 142, 144 are disposed "all-around" or surrounding the individual channel structures 134, 136, 138 (i.e., based on the template or structure previously created by dummy gates 424, 426, 428). As previously noted, the channel structures 134, 136, 138 have different crystalline orientations 110, 114 respectively. Further, as shown in FIG. 1D, a Y-Y' cross-sectional view of gate 142 is shown to illustrate that metal gate 142 (and likewise metal gates 140 and 144) includes a PFET metal gate 146 and NFET metal gate 148. The gate 142 has an all-around structure to provide better electrical control over the channel structures 134, 136, 138, which have different crystalline orientations 110, 114. Gates 140, 144 are not shown in FIG. 1D, but will have similar structure in terms of an all-around structure and respective PFET metal gates and NFET metal gates such as shown for metal gate 142.

To insulate from the metal gates 140, 142, 144, a gate dielectric layer 150 may be deposited around the channel structures 134, 136, 138. The gate dielectric layer 150 provides an insulating layer between the metal gates 140, 142, 144, and the channel material in the channel structures 134, 136, 138. For example, as shown in FIG. 1D, metal gate 142 includes a PFET metal gate 146 and an NFET metal gate 148 insulated by the gate dielectric layer 150 from the channel structures 134, 136, 138. The insulation of the gate dielectric layer 150 allows the metal gate 142 to have electrical control of current flowing through the channel structures 134, 136, 138. The gate dielectric layer 150 may be any suitable material, such as an oxide or silicon dioxide, a high-K dielectric material, or a metal-oxide dielectric.

In addition, at this fabrication stage 104, the GAA FET device 100 now comprises a fill material 152, a middle-of-line (MOL) contact layer 154, a via layer 156, and a back-end-of-the-line (BEOL) layer 158. These elements will now be briefly described.

Fill material 152 is the material filled into the empty spaces or gaps between the components of the GAA FET device 100. Fill material 152 is used to provide electrical isolation and mechanical support. Fill material 152 may be any suitable material, such as silicon dioxide, silicon nitride, epoxy, etc.

The MOL contact layer 154 provides contact structures and interconnects between the components of the GAA FET device 100 and the other, upper layers of the GAA device 100. The contact structures and interconnects of MOL contact layer 154 may be formed using processes, such as deposition, lithography, and etching. The layout and number of contacts provided in the MOL contact layer 154 can depend on the intended use of the GAA FET device 100. The MOL contact layer 154 is shown as a simplified layer and is for illustrative purposes only. The MOL contact layer 154 may comprise various materials including metals (such as copper), interlayer dielectrics (such as silicon dioxide or silicon nitride), and/or insulating materials.

The via layer 156 provides vias that extend in the second, vertical direction between the layers of the GAA FET device 100 and establish electrical connections between the layers of the GAA FET device 100. The via layer 156 may comprise various materials, including metals (such as copper) and insulating material (such as silicon dioxide), to establish each via and isolate each via from each other.

The BEOL layer 158 is provided as the back end (or top layer) for the GAA FET device 100 and provides the final electrical interconnections between the GAA FET device 100 and other elements, for example, for an integrated circuit. The BEOL layer 158 is formed at the later or final stages of fabrication of the GAA FET device 100.

For example, in one aspect, the GAA FET device 100 is configured as a CMOS device, and hence, the GAA PFET(s) 132P and GAA NFET(s) 132N operate in a complementary fashion. For example, the gates 140, 142, 144 may be connected to the same signal. A positive voltage turns "on" the GAA NFET(s) 132N and keeps the GAA PFET(s) 132P in the "off" state. For example, a positive voltage applied to the GAA NFET(s) 132N turns it on by inverting the NFET channel structures, such as channel structure 138 with electrons and allowing conduction. This has the effect of pulling down the output value of the GAA NFET(s) 132N to the source value. Usually, the GAA NFET(s) 132N source voltage is zero or connected to ground. Conversely, a negative voltage turns "on" the GAA PFET(s) 132P and turns "off" the GAA NFET(s) 132N. This voltage has the effect of pulling up the output voltage to the GAA PFET(s) 132P source value. Usually the GAA PFET(s) 132P source voltage is connected to a supply voltage, e.g., Vdd. The figures show the GAA PFET(s) 132P and GAA NFET(s) 132N with different numbers of channel structures, e.g., channel structures 134, 136, 138 for illustrative purposes only. In one aspect, the GAA PFET(s) 132P and GAA NFET(s) 132 have the same number of channel structures. In another aspect, the GAA PFET(s) 132P and GAA NFET(s) 132 have a different number of channel structures.

Figures 1, 2, 3C, 4E, 4F:
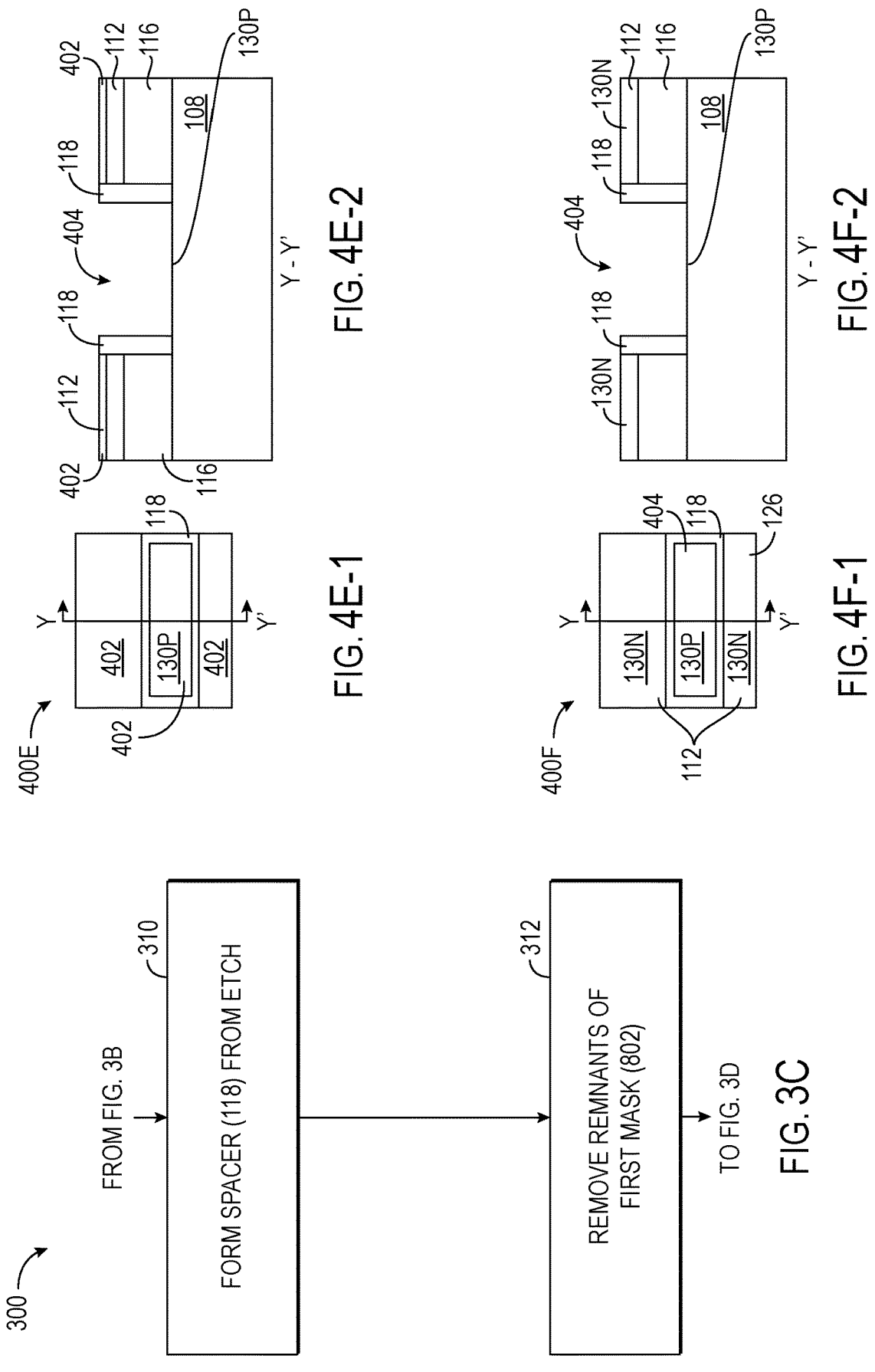

As discussed in more detail below, fabrication processes (such as processes 200 shown in FIGS. 2 and 300 shown in FIGS. 3A-3G) can be employed to fabricate a GAA FET device 100 that includes a PFET(s) and an NFET(s) provided on a respective first region 108 and second region 112 of a substrate 106 with different crystalline orientations 110 and 114 to form respective channel structures 134, 136, 138 of such different crystalline orientations 110 and 114 for affecting carrier mobility, including, but not limited to, the GAA FET device 100 comprising the GAA PFET(s) 132P and/or the GAA NFET(s) 132N in FIGS. 1A-1D.

In addition, in another exemplary aspect, the GAA FET device 100 is fabricated having the channel structures 134, 136, 138 that are aligned co-planar in a first, horizontal directional (e.g., in the X-Y plane shown in FIGS. 1A-1D) and with uniform layer thickness. During fabrication, the separation provided by the spacer surface 126 of spacer 118 and isolation structure surface 128 of isolation structure 120 at the hybrid surface 122 allows a process to grow semi-conductor layers co-planar and unconstrained within the same fabrication pass, i.e., without the need for a pattern or mask. Unconstrained, co-planar growth enables growth of high quality, uniform thickness layers since it is not con-strained by a pattern or mask. These high quality co-planar layers allow for greater design flexibility, better fabrication process yields, and better device performance by the GAA FET device 100 and processes 200, 300, discussed below.

In this regard, FIG. 2 is a flowchart illustrating an exem-plary fabrication process 200 of fabricating a GAA FET device 100 that includes a PFET(s) 132P and an NFET(s) 132N provided on a respective first region 108 and second region 112 of a substrate 106 with different crystalline orientations 110 and 114. As explained regarding the process 200, the channel structures 134, 136, 138 are grown from a hybrid surface 122, which enables different crystalline ori-entations 110 and 114 to be grown for affecting carrier mobility.

In this regard, an exemplary step in the fabrication process 200 for fabricating the GAA FET device 100 can include providing a substrate 106 comprising a hybrid surface 122, a first region 108 having a first crystalline orientation 110, an isolation layer 116 extending in a first, horizontal direction at the hybrid surface 122 provided on the first region 108, and a second region 112 provided on the isolation layer 116 having a second crystalline orientation 114 (block 202 in FIG. 2). A next step in the fabrication process can include forming a spacer 118 extending in the first, horizontal direction at the hybrid surface 122 and in a second, vertical direction orthogonal to the first direction into the substrate 106 (block 204 in FIG. 2).

A next step in the fabrication process can include forming an isolation structure 120. The isolation structure 120 may be formed to extend to various depths into the substrate 106, such as the same depth as the isolation layer 116, or deeper. In one aspect, as shown in FIGS. 1A-1D, the isolation structure 120 may be a deeper structure, and hence, fabri-cated to extend in the first, horizontal direction at the hybrid surface 122 and in the second, vertical direction orthogonal to the first, horizontal direction deeper, such as 50-100 nm or more, into the substrate 106 (block 206 in FIG. 2). In the Figures, isolation structure 120 is shown as extending deeper than the isolation layer 116 for illustrative purposes. The isolation structure 120 can extend into the substrate 106 to any depth to achieve the desired electrical isolation. A next step in the fabrication process can include forming a GAA PFET 132P having P-type channel structures 134, 136 provided on the first region 108. The P-type channel struc-tures 134, 136 have the first crystalline orientation 110 (block 208 in FIG. 2). A next step in the fabrication process can include forming a GAA NFET 132N having an N-type channel structure 138 provided on the second region 112 from the hybrid surface 122 in the second, vertical direction opposite from the spacer 118. The N-type channel structure 138 has the second crystalline orientation 114 (block 210 in FIG. 2).

The fabrication process 200 in FIG. 2 can be employed to fabricate a CMOS circuit, or other devices as noted above. Other fabrication processes can also be employed to fabri-cate a GAA FET device with a GAA PFET(s) and GAA NFET(s) having channels with different crystalline orienta-tions, such as the crystalline orientations 110 and 114, grown from the hybrid surface 122 of the substrate 106. The fabrication process 200 in FIG. 2 is discussed with regard to GAA FET device 100, but it is not limited to fabricating GAA FET devices like the GAA FET device 100.

FIGS. 3A-3G is a flowchart illustrating another exem-plary fabrication process 300 of fabricating a GAA FET device provided on a substrate 106 having a first region 108 and second region 112 with different crystalline orientations 110, 114, and comprising respective first and second sur-faces 130P. 130N to provide a GAA PFET(s) 132P having P-type channel structures 134, 136 on the first surface 130P with a first crystalline orientation 110, and a GAA NFET(s) 132N having an N-type channel structure 138 on the second surface 130N with a second crystalline orientation 114, including, but not limited to, the GAA FET device 100 illustrated in FIGS. 1A and 1B. FIGS. 4A-4N-2 are exem-plary fabrication stages during fabrication of a GAA FET device provided on a substrate 106 having first and second regions 108, 112, with different crystalline orientations 110, 114, and comprising respective first and second surfaces 130P, 130N, according to the exemplary fabrication process 300 in FIGS. 3A-3G. The fabrication process 300 in FIGS. 3A-3G is discussed with regard to fabricating the GAA FET device 100, GAA PFET(s) 132P, and GAA NFET(s) 132N shown in FIGS. 1A and 1B as a non-limiting example. FIGS. 4A-4N-2 are also provided to illustrate the fabrication stages used, for example, in the fabrication process 300. As shown, FIGS. 4A-4N-2 illustrate simplified top views and cross-sectional (Y-Y') views.

In this regard, an exemplary fabrication stage 400A in FIG. 4A-1 shows a top view and FIG. 4A-2 shows a cross-sectional (Y-Y') view in which a substrate 106 is provided (block 302 in FIG. 3A). At this fabrication stage, the substrate 106 comprises a first region 108 having a first crystalline orientation 110, a second region 112 having a second crystalline orientation 114, and an isolation layer 116. The isolation layer 116 is disposed between the first region 108 and the second region 112 in the second, vertical direction. As shown in FIG. 4A-1, a top view is shown of the second region 112 and its surface 130N. Next, in fabrication stage 400B as shown in FIG. 4B-1 illustrating top view and a cross-sectional (Y-Y') view in FIG. 4B-2, a mask 402 is formed on the surface 130N of the second region 112 (block 304 in FIG. 3A).

Next, an exemplary fabrication stage 400C is shown in FIG. 4C-1 illustrating a top view and a cross-sectional (Y-Y') view in FIG. 4C-2 in which a trench 404 is etched through the surface 130N of the second region 112 and isolation layer 116 to expose the surface 130P of the first region 108 (block 306 in FIG. 3B). Next, a fabrication stage 400D shown in FIG. 4D-1 showing a top view and a cross-sectional (Y-Y') view in FIG. 4D-2 in which a layer of spacer material 406 for spacer 118, such as silicon dioxide or silicon nitride, is deposited onto remaining portions of the mask 402, surfaces of the trench 404, and the exposed surface 130P of the first region 108 (block 308 in FIG. 3B).

Next, a fabrication stage 400E is shown in FIG. 4E-1 illustrating a top view and a cross-sectional (Y-Y') view in FIG. 4E-2 where the surface 130P of the first region 108 is exposed again. This is performed by etching portions of the layer of spacer material 406, such as using a dry etch, reactive ion etching, or plasma etching. The spacer 118 remains and extends in the second, vertical direction (Z-axis direction) on the sidewalls of the trench 404 (block 310 in FIG. 3C). As shown, in this example, the spacer 118 extends to the same depth as the isolation layer 116 to now provide isolation laterally in the first, horizontal direction between the first region 108, the isolation layer 116, and the second region 112. As will be explained further below, this lateral isolation provided by the spacer 118 will later enable fabrication of the channel structures 134, 136, 138 to have different crystalline orientations 110, 114. Next, a fabrication stage 400F is shown in FIG. 4F-1 showing a top view and a cross-sectional view in FIG. 4F-2 in which remnants of the mask 402 on the surface 130N of the second region 112 are removed, such as using a wet etch and/or cleaning process (block 312 in FIG. 3C). Thus, surfaces 130N and 130P and their respective crystalline orientations 110, 114 are now exposed, which will enable the channel structures 134, 136, 138 to be fabricated with different crystalline orientations. The surfaces 130N and 130P are separated laterally in the first, horizontal direction by the spacer 118 and separated vertically in the second, vertical direction by the isolation layer 116.

Next, as shown fabrication stage 400G in FIG. 4G-1 a top view and cross-sectional (Y-Y') view in FIG. 4G-2 are illustrated. In this fabrication stage, the trench 404 is filled with a semiconductor material 410 having the same crystalline orientation 110 as the first region 108, for example, using epitaxial growth or a vapor deposition process (block 314 in FIG. 3D). Annealing may also be performed to improve the quality of the semiconductor material 410 and/or remove any defects or impurities from the semiconductor material 410. Accordingly, the surface 130P having the crystalline orientation 110 of the first region 108 has been extended to be co-planar with the second surface 130N having the different, second crystalline orientation 114 of the second region 112. In addition, the spacer 118 provides a lateral separation in the first, horizontal direction (e.g., in the X-Y axes) between the surfaces 130P, 130N. Next, a fabrication stage 400H is shown in FIG. 4H-1 with a top view and a cross-sectional (Y-Y') view FIG. 4H-2 in which a lattice 412 is formed comprising alternating layers of silicon (Si) 414-1, 414-2, 414-3 having respective crystalline orientations 110, 114 grown from surfaces 130P, 130N and layers of silicon germanium (SiGe) 416-1, 416-2, 416-3 via chemical vapor deposition or molecular beam epitaxy to deposit each layer on top of each other (block 316 in FIG. 3D). Of note, the layers of silicon 414-1, 414-2, 414-3 in the lattice 412 will comprise the same crystalline orientation 110, 114 of the surface (i.e., surfaces 130P or 130N) from which they originate, which is indicated by the dashed lines shown in FIG. 4H-2. In addition, the formation of these layers 414-1, 414-2, 414-3 and 416-1, 416-2, 416-3 can occur within the same pass because the hybrid surface 122 is planar at this fabrication stage. Thus, the layers of the lattice 412 can be grown unconstrained.

Figures 1, 2, 3E, 4I, 4J:
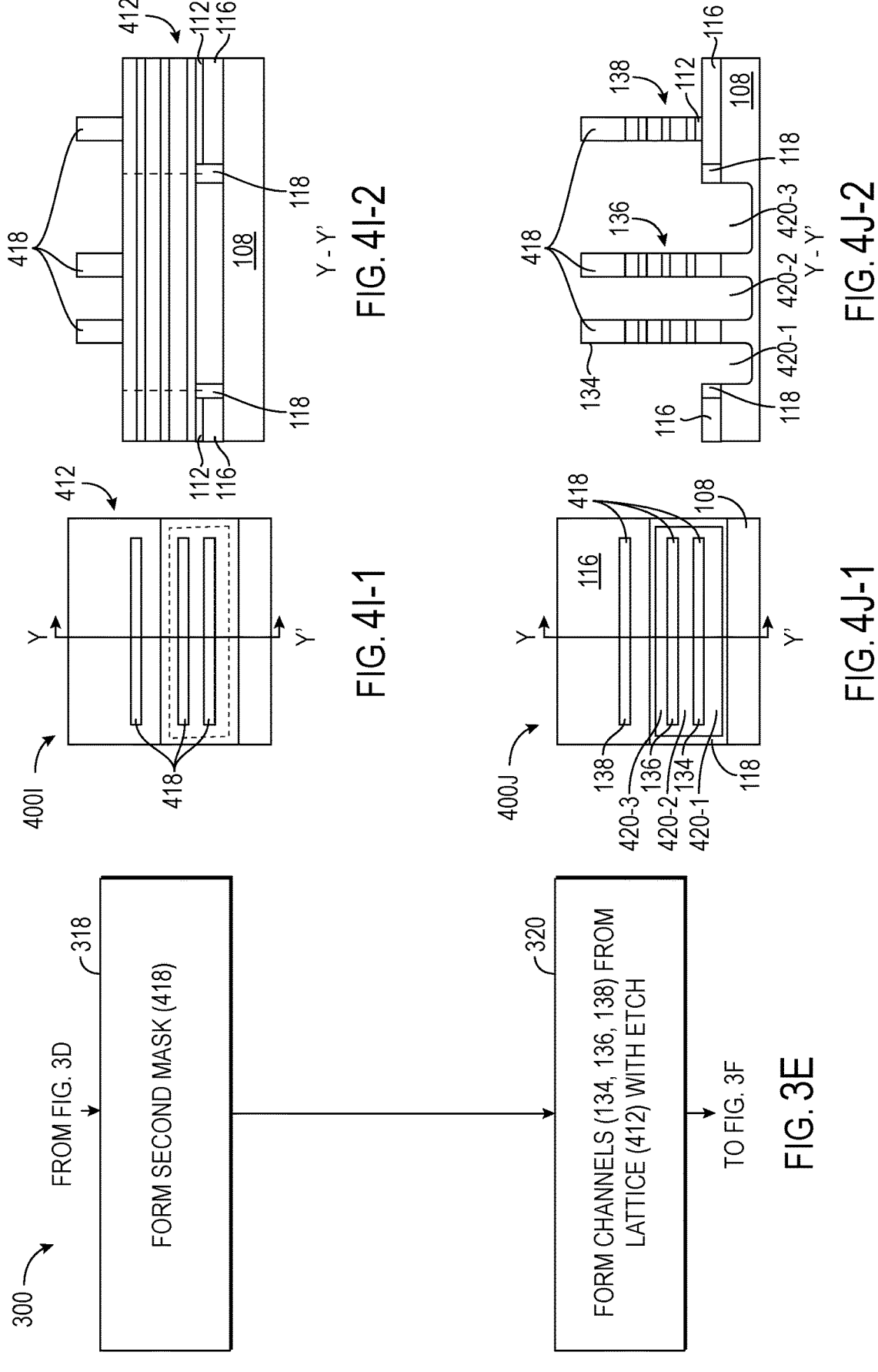

Next, a fabrication stage 400I shown in FIG. 4I-1 with a top view and a cross-sectional (Y-Y') view in FIG. 4I-2 in which a second mask 418 is provided on the lattice 412 (block 318 in FIG. 3E). Next, a fabrication stage 400J is shown in FIG. 4J-1 with a top view and a cross-sectional view in FIG. 4J-2 in which the lattice 412 is etched to form fin-like structures for the channel structures 134, 136, 138 (block 320 in FIG. 3E). As shown, an anistropic etch is used to preferentially etch the lattice 412 to form the channel structures 134, 136, 138. As also shown, portions of the first region 108 are etched, which results in trenches 420-1, 420-2, 420-3. In one aspect, these trenches 420-1, 420-2, 420-3 are etched into the substrate 106, for example, to a depth of 50-100 nm, or more. The trenches 420-1, 420-2, 420-3 are shown to be etched deeper into the substrate 106 for illustrative purposes only.

Next, a fabrication stage 400K is shown in FIG. 4K-1 with a top view and a cross-sectional (Y-Y') view in FIG. 4K-2 in which an isolation material 422, such as an oxide material, is filled in around the channel structures 134, 136, 138 and in the trenches 420-1, 420-2, 420-3 (see block 322 in FIG. 3F). The isolation material 422 may be deposited or filled in, for example, using a high-density plasma process to avoid seams or voids. Additionally, in one aspect, the isolation material 422 is filled at a relatively low temperature so as not to disturb the lattice 412 of Si/SiGe layers 414-1, 414-2, 414-3 and 416-1, 416-2, 416-3. Next, a fabrication stage 400L is shown in FIG. 4L-1 with a top view and a cross-sectional (Y-Y') view in FIG. 4L-2 in which the channel structures 134, 136, 138 are revealed by removal or etching of the isolation material 422 (see block 324 in FIG. 3F). The remaining portions of the isolation material 422 left in trenches 420-1, 420-2, 420-3 form the isolation structure 120. This etch of the isolation material 422 also removes portions of the second region 112 remaining around the channel structure 138 to again expose the isolation layer surface 124 of the isolation layer 116, the spacer surface 126 of the spacer 118, and the isolation structure surface 128 of the isolation structure 120, i.e., for the hybrid surface 122. In addition, the mask 418 may be removed after the reveal of the channel structures 134, 136, 138.

Other processes may be performed (not shown for purposes of brevity and clarity) to complete the fabrication of the GAA FET device 100, such as gate patterning using lithography and etching (see block 326 in FIG. 3F), formation of inner spacers (see block 328 in FIG. 3F), forming NFET/PFET epitaxial layers for the source/drains for PFET(s) 132P and NFET(s) 132N (see block 330 in FIG. 3E), and ion implantation for the source/drains for PFET(s) 132P and NFET(s) 132N (see block 332 in FIG. 3F).

Figures 1, 2, 3G, 4M, 4N:
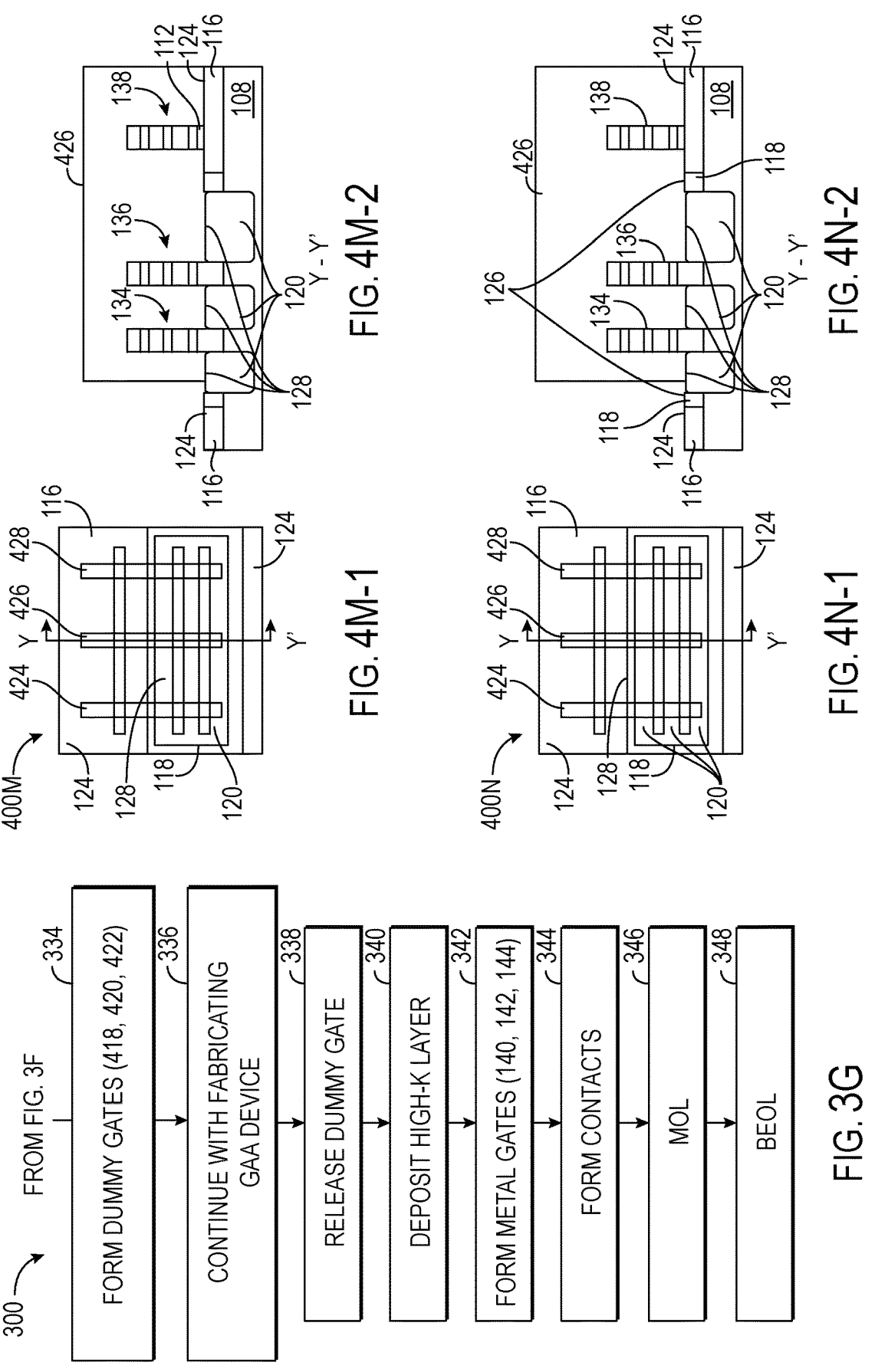

Next, as shown in FIG. 4M-1 with a top view and a cross-sectional (Y-Y') view in FIG. 4M-2, dummy gates 424, 426, 428 are formed on the channel structures 134, 136, 138 (see block 334 in FIG. 3G). The dummy gates 424, 426, 428 may be various materials, such as metal or polysilicon. As noted above, the dummy gates 424, 426, 428 serve as a template or placeholder for the metal gates 140, 142, 144 (not shown in FIG. 4M-1 or 4M-2) and at this stage of fabrication are not electrically connected. In addition, one or more of the dummy gates 424, 426, 428 may remain in the GAA FET device 100 as non-functional structures, e.g., not electrically connected. Next, as shown in FIG. 4N-1 with a top view and a cross-sectional (Y-Y') view in FIG. 4N-2, fabrication processing for the GAA PFET(s) 132P and GAA NFET(s) 132N continues (see block 336 in FIG. 3G). For example, the dummy gates 424, 426, 428 (or portions thereof) may be released or removed (see block 338 in FIG. 3G), isolation or high-K dielectric material may be deposited (see block 340 in FIG. 3G), and metal gates 140, 142, 144 are formed on the channel structures 134, 136, 138 (see block 342 in FIG. 3G). Finishing processes are then performed to complete the fabrication of the GAA FET device 100 with the GAA PFET(s) 132P and GAA NFET(s) 132N including, for example, forming contacts for the gates (such as the gates 140, 142, 144) (see block 344 in FIG. 3G), MOL processes (such as metal interconnect processes), such as to form the MOL contact layer 154 and via layer 156 (see block 346 in FIG. 3G), and BEOL processes (such as metal wiring, via formation, and packaging), such as to form the BEOL layer 158 (see block 348 in FIG. 3G).

Electronic devices that include an exemplary GAA FET device that includes a PFET and an NFET provided on respective first and second regions of a substrate with different crystalline orientations to form respective channels of such different crystalline orientations for affecting carrier mobility, including, but not limited to the GAA FET device 100 in FIGS. 1C and 1D and according to, but not limited to, any of the exemplary fabrication processes 200, 300 in FIGS. 2 and 3A-3G, and according to any aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, laptop computer, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, an avionics system, a drone, and a multicopter.

Figure 5:
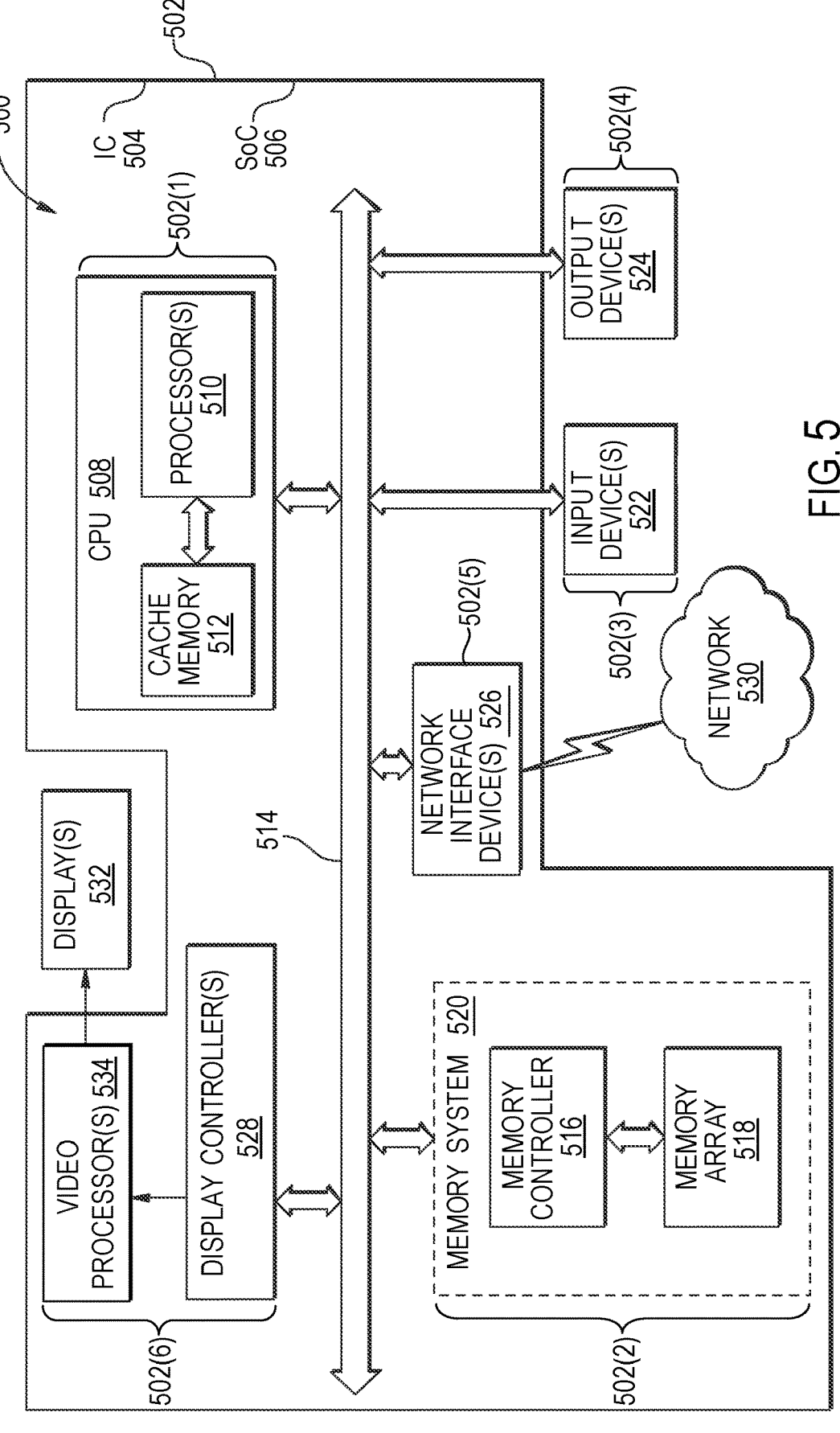
FIG. 5 is a block diagram of an exemplary processor-based system that can include a GAA FET device provided on a substrate having hybrid orientations including, but not limited to, the GAA FET devices in FIGS. 1C and 1D and according to, but not limited to, any of the exemplary fabrication processes in FIGS. 2 and 3A-3G.

In this regard, FIG. 5 is a block diagram of an exemplary processor-based system 500 that can include a GAA FET device 502 (such as the GAA FET device 100) provided on a substrate having hybrid orientations including, but not limited to, the GAA FET device 100 in FIGS. 1C and 1D and according to, but not limited to, any of the exemplary fabrication processes 200 and 300 in FIGS. 2 and 3A-3G. In this example, the processor-based system 500 may be formed as an IC 504 that includes one or more of the GAA FET devices 502 and as a system-on-a-chip (SoC) 506. The processor-based system 500 includes a central processing unit (CPU) 508 that includes one or more processors 510, which may also be referred to as CPU cores or processor cores. The CPU 508 may have cache memory 512 coupled to the CPU 508 for rapid access to temporarily stored data. The CPU 508 is coupled to a system bus 514 and can intercouple master and slave devices included in the processor-based system 500. As is well known, the CPU 508 communicates with these other devices by exchanging address, control, and data information over the system bus 514. For example, the CPU 508 can communicate bus transaction requests to a memory controller 516, as an example of a slave device. Although not illustrated in FIG. 5, multiple system buses 514 could be provided, wherein each system bus 514 constitutes a different fabric.

Other master and slave devices can be connected to the system bus 514. As illustrated in FIG. 5, these devices can include a memory system 520 that includes the memory controller 516 and a memory array(s) 518, one or more input devices 522, one or more output devices 524, one or more network interface devices 526, and one or more display controllers 528, as examples. Each of the memory system(s) 520, the one or more input devices 522, the one or more output devices 524, the one or more network interface devices 526, and the one or more display controllers 528 can be provided in the same or different electronic devices

502(2)-502(6). The input device(s) 522 can include any type of input device, including, but not limited to, input keys, switches, voice processors, etc. The output device(s) 524 can include any type of output device, including, but not limited to, audio, video, other visual indicators, etc. The network interface device(s) 526 can be any device configured to allow exchange of data to and from a network 530. The network 530 can be any type of network, including, but not limited to, a wired or wireless network, a private or public network, a local area network (LAN), a wireless local area network (WLAN), a wide area network (WAN), a BLU-ETOOTH™ network, and the Internet. The network interface device(s) 526 can be configured to support any type of communications protocol desired.

The CPU 508 may also be configured to access the display controller(s) 528 over the system bus 514 to control information sent to one or more displays 532. The display controller(s) 528 sends information to the display(s) 532 to be displayed via one or more video processor(s) 534, which process the information to be displayed into a format suitable for the display(s) 532. The display controller(s) 528 and video processor(s) 534 can be included as ICs in the same or different electronic devices 502(6), and in the same or different electronic devices 502(1) containing the CPU 508, as an example. The display(s) 532 can include any type of display, including, but not limited to, a cathode ray tube (CRT), a liquid crystal display (LCD), a plasma display, a light emitting diode (LED) display, etc.

Figure 6:
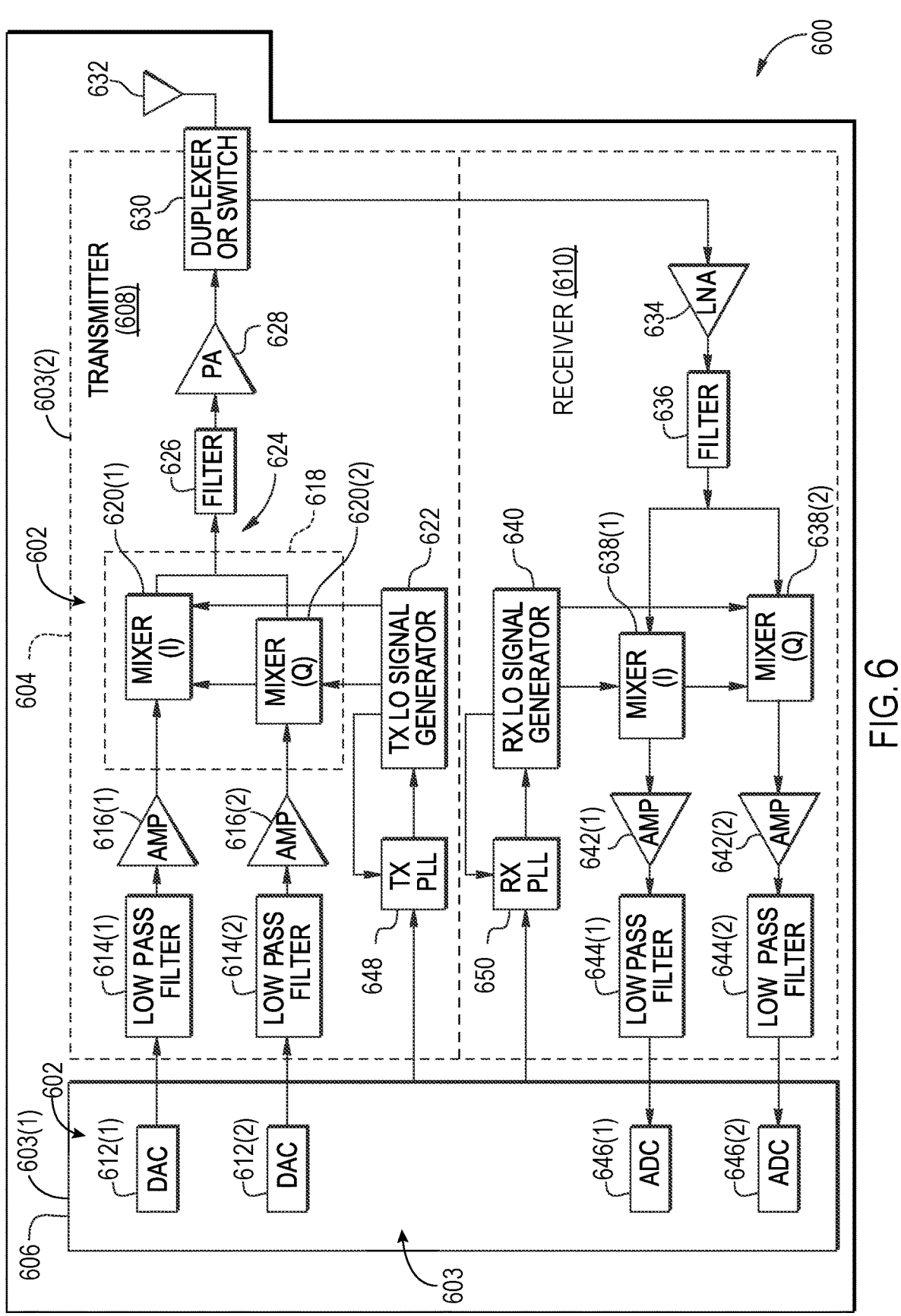
FIG. 6 is a block diagram of an exemplary wireless communication device that includes radio-frequency (RF) components that can include a GAA FET device provided on a substrate having hybrid orientations including, but not limited to, the GAA FET devices in FIGS. 1C and 1D and according to, but not limited to, any of the exemplary fabrication processes in FIGS. 2 and 3A-3G.

FIG. 6 is a block diagram of an exemplary wireless communication device that includes radio-frequency (RF) components that can include a GAA FET device provided on a substrate having hybrid orientations including, but not limited to, the GAA FET device 100 in FIGS. 1C and 1D and according to, but not limited to, any of the exemplary fabrication processes in FIGS. 2 and 3A-3G. The wireless communications device 600 may include or be provided in any of the above-referenced devices, as examples. As shown in FIG. 6, the wireless communications device 600 includes a transceiver 604 and a data processor 606. The data processor 606 may include a memory to store data and program codes. The transceiver 604 includes a transmitter 608 and a receiver 610 that support bi-directional communications. In general, the wireless communications device 600 may include any number of transmitters 608 and/or receivers 610 for any number of communication systems and frequency bands. All or a portion of the transceiver 604 may be implemented on one or more analog ICs, RF ICs (RFICs), mixed-signal ICs, etc.

The transmitter 608 or the receiver 610 may be implemented with a super-heterodyne architecture or a direct-conversion architecture. In the super-heterodyne architecture, a signal is frequency-converted between RF and baseband in multiple stages, for example, from RF to an intermediate frequency (IF) in one stage, and then from IF to baseband in another stage for the receiver 610. In the direct-conversion architecture, a signal is frequency-converted between RF and baseband in one stage. The super-heterodyne and direct-conversion architectures may use different circuit blocks and/or have different requirements. In the wireless communications device 600 in FIG. 6, the transmitter 608 and the receiver 610 are implemented with the direct-conversion architecture.

In the transmit path, the data processor 606 processes data to be transmitted and provides I and Q analog output signals to the transmitter 608. In the exemplary wireless communications device 600, the data processor 606 includes digital-to-analog converters (DACs) 612(1), 612(2) for converting digital signals generated by the data processor 606 into the I and Q analog output signals (e.g., I and Q output currents) for further processing.

Within the transmitter 608, lowpass filters 614(1), 614(2) filter the I and Q analog output signals, respectively, to remove undesired signals caused by the prior digital-to-analog conversion. Amplifiers (AMPs) 616(1), 616(2) amplify the signals from the lowpass filters 614(1), 614(2), respectively, and provide I and Q baseband signals. An upconverter 618 upconverts the I and Q baseband signals with I and Q transmit (TX) local oscillator (LO) signals through mixers 620(1), 620(2) from a TX LO signal generator 622 to provide an upconverted signal 624. A filter 626 filters the upconverted signal 624 to remove undesired signals caused by the frequency up-conversion as well as noise in a receive frequency band. A power amplifier (PA) 628 amplifies the upconverted signal 624 from the filter 626 to obtain the desired output power level and provides a transmit RF signal. The transmit RF signal is routed through a duplexer or switch 630 and transmitted via an antenna 632.

In the receive path, the antenna 632 receives signals transmitted by base stations and provides a received RF signal, which is routed through the duplexer or switch 630 and provided to a low noise amplifier (LNA) 634. The duplexer or switch 630 is designed to operate with a specific receive (RX)-to-TX duplexer frequency separation, such that RX signals are isolated from TX signals. The received RF signal is amplified by the LNA 634 and filtered by a filter 636 to obtain a desired RF input signal. Down-conversion mixers 638(1), 638(2) mix the output of the filter 636 with I and Q RX LO signals (i.e., LO_I and LO_Q) from an RX LO signal generator 640 to generate I and Q baseband signals. The I and Q baseband signals are amplified by AMPs 642(1), 642(2) and further filtered by lowpass filters 644(1), 644(2) to obtain I and Q analog input signals, which are provided to the data processor 606. In this example, the data processor 606 includes analog-to-digital converters (ADCs) 646(1), 646(2) for converting the analog input signals into digital signals to be further processed by the data processor 606.

In the wireless communications device 600 of FIG. 6, the TX LO signal generator 622 generates the I and Q TX LO signals used for frequency up-conversion, while the RX LO signal generator 640 generates the I and Q RX LO signals used for frequency down-conversion. Each LO signal is a periodic signal with a particular fundamental frequency. A TX phase-locked loop (PLL) circuit 648 receives timing information from the data processor 606 and generates a control signal used to adjust the frequency and/or phase of the TX LO signals from the TX LO signal generator 622. Similarly, an RX PLL circuit 650 receives timing information from the data processor 606 and generates a control signal used to adjust the frequency and/or phase of the RX LO signals from the RX LO signal generator 640.

Those of skill in the art will further appreciate that the various illustrative logical blocks, modules, circuits, and algorithms described in connection with the aspects disclosed herein may be implemented as electronic hardware, instructions stored in memory or in another computer readable medium wherein any such instructions are executed by a processor or other processing device, or combinations of both. The devices and components described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure.

Thus, the disclosure is not intended to be limited to the examples and designs described herein, but is to be accorded the widest scope consistent with the principles and novel features disclosed herein.

Implementation examples are described in the following numbered clauses:

1. A gate-all-around (GAA) field-effect transistor (FET) device, comprising:
    a substrate, comprising:
        a first region having a first crystalline orientation;
        an isolation layer in the substrate;
        a second region on the isolation layer having a second crystalline orientation;
        a spacer in the substrate; and
        an isolation structure in the substrate;
    a GAA P-type semiconductor FET (PFET) having a P-type channel in the first region, wherein the P-type channel has the first crystalline orientation; and
    a GAA N-type semiconductor FET (NFET) having an N-type channel in the second region, wherein the N-type channel has the second crystalline orientation.

2. The GAA FET device of clause 1, wherein:
    the P-type channel comprises a first P-type channel structure and a second P-type channel structure;
    the N-type channel comprises a first N-type channel structure and a second N-type channel structure;
    the first P-type channel structure is co-planar with the first N-type channel structure; and
    the second P-type channel structure is co-planar with the second N-type channel structure.

3. The GAA FET device of any of clauses 1-2, wherein the P-type channel has the first crystalline orientation that comprises a <110> crystalline orientation.

4. The GAA FET device of any of clauses 1-3, wherein the N-type channel has the second crystalline orientation that comprises a <100> crystalline orientation.

5. The GAA FET device of any of clauses 1-4, wherein the spacer separates the isolation layer and the isolation structure.

6. The GAA FET device of any of clauses 1-5, wherein the spacer extends to a same depth into the substrate as the isolation layer.

7. The GAA FET device of any of clauses 1-6, wherein the isolation layer comprises silicon dioxide ($SiO_2$).

8. The GAA FET device of any of clauses 1-7, wherein the isolation structure separates the spacer and the first region of the substrate.

9. The GAA FET device of any of clauses 1-8, wherein the isolation structure extends deeper into the substrate than the spacer.

10. The GAA FET device of any of clauses 1-9 integrated into an integrated circuit (IC).

11. The GAA FET device of any of clauses 1-10 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; an avionics systems; a drone; and a multicopter.

12. A method of fabricating a gate-all-around (GAA) field effect transistor (FET) device, comprising:
    providing a substrate comprising a first region having a first crystalline orientation, an isolation layer in the substrate, and a second region on the isolation layer having a second crystalline orientation;
    forming a spacer in the substrate;
    forming an isolation structure in the substrate;
    forming a GAA P-type semiconductor FET (PFET) having a P-type channel in the first region, wherein the P-type channel has the first crystalline orientation; and
    forming a GAA N-type semiconductor FET (NFET) having an N-type channel in the second region, wherein the N-type channel has the second crystalline orientation.

13. The method of clause 12, wherein:
    forming the GAA PFET having the P-type channel comprises forming a first P-type channel structure and a second P-type channel structure;
    forming the GAA NFET having the N-type channel comprises forming a first N-type channel structure in a same fabrication step as the first P-type channel structure and a second N-type channel structure in a same fabrication step as the second P-type channel structure;
    the first P-type channel structure is co-planar with the first N-type channel structure; and
    the second P-type channel structure is co-planar with the second N-type channel structure.

14. The method of any of clauses 12-13, wherein the P-type channel comprises a <110> crystalline orientation.

15. The method of any of clauses 12-14, wherein the N-type channel comprises a <100> crystalline orientation.

16. The method of any of clauses 12-15, wherein forming the spacer further comprises forming the spacer to separate the isolation layer and the isolation structure.

17. The method of any of clauses 12-16, wherein forming the spacer further comprises forming the spacer to extend to a same depth into the substrate as the isolation layer.

18. The method of any of clauses 12-17, wherein forming the isolation structure further comprises forming the isolation structure to separate the spacer and the first region of the substrate.

19. The method of any of clauses 12-18, wherein forming the isolation structure comprises forming the isolation structure to extend deeper into the substrate than the spacer.

What is claimed is:

1. A gate-all-around (GAA) field-effect transistor (FET) device, comprising:
    a substrate, comprising:
        a first region having a first crystalline orientation;
        an isolation layer in the substrate;
        a second region on the isolation layer having a second crystalline orientation;
        a spacer in the substrate, wherein the spacer extends to a same depth into the substrate as the isolation layer; and
        an isolation structure in the substrate;
    a GAA P-type semiconductor FET (PFET) having a P-type channel in the first region, wherein the P-type channel has the first crystalline orientation; and
    a GAA N-type semiconductor FET (NFET) having an N-type channel in the second region, wherein the N-type channel has the second crystalline orientation.

2. The GAA FET device of claim 1, wherein:

the P-type channel comprises a first P-type channel structure and a second P-type channel structure;

the N-type channel comprises a first N-type channel structure and a second N-type channel structure;

the first P-type channel structure is co-planar with the first N-type channel structure; and the second P-type channel structure is co-planar with the second N-type channel structure.

3. The GAA FET device of claim 1, wherein the P-type channel has the first crystalline orientation that comprises a <110> crystalline orientation.

4. The GAA FET device of claim 1, wherein the N-type channel has the second crystalline orientation that comprises a <100> crystalline orientation.

5. The GAA FET device of claim 1, wherein the spacer separates the isolation layer and the isolation structure.

6. The GAA FET device of claim 1, wherein the isolation layer comprises silicon dioxide ($SiO_2$).

7. The GAA FET device of claim 1, wherein the isolation structure separates the spacer and the first region of the substrate.

8. The GAA FET device of claim 1, wherein the isolation structure extends deeper into the substrate than the spacer.

9. The GAA FET device of claim 1 integrated into an integrated circuit (IC).

10. The GAA FET device of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; an avionics systems; a drone; and a multicopter.

11. A method of fabricating a gate-all-around (GAA) field effect transistor (FET) device, comprising:

providing a substrate comprising a first region having a first crystalline orientation, an isolation layer in the substrate, and a second region on the isolation layer having a second crystalline orientation;

forming a spacer in the substrate to extend to a same depth into the substrate as the isolation layer;

forming an isolation structure in the substrate;

forming a GAA P-type semiconductor FET (PFET) having a P-type channel in the first region, wherein the P-type channel has the first crystalline orientation; and forming a GAA N-type semiconductor FET (NFET) having an N-type channel in the second region, wherein the N-type channel has the second crystalline orientation.

12. The method of claim 11, wherein:

forming the GAA PFET having the P-type channel comprises forming a first P-type channel structure and a second P-type channel structure;

forming the GAA NFET having the N-type channel comprises forming a first N-type channel structure in a same fabrication step as the first P-type channel structure and a second N-type channel structure in a same fabrication step as the second P-type channel structure;

the first P-type channel structure is co-planar with the first N-type channel structure; and the second P-type channel structure is co-planar with the second N-type channel structure.

13. The method of claim 12, wherein the P-type channel comprises a <110> crystalline orientation.

14. The method of claim 11, wherein the N-type channel comprises a <100> crystalline orientation.

15. The method of claim 11, wherein forming the spacer further comprises forming the spacer to separate the isolation layer and the isolation structure.

16. The method of claim 11, wherein forming the isolation structure further comprises forming the isolation structure to separate the spacer and the first region of the substrate.

17. The method of claim 11, wherein forming the isolation structure comprises forming the isolation structure to extend deeper into the substrate than the spacer.

* * * * *